United States Patent [19]

Seip

[11] Patent Number: 5,779,870
[45] Date of Patent: Jul. 14, 1998

[54] METHOD OF MANUFACTURING LAMINATES AND PRINTED CIRCUIT BOARDS

[75] Inventor: D. Eric Seip, Mission Viejo, Calif.

[73] Assignee: Polyclad Laminates, Inc., West Franklin, N.H.

[21] Appl. No.: 422,510

[22] Filed: Apr. 13, 1995

Related U.S. Application Data

[63] Which is a continuation-in-part of PCT/US94/02309, Mar. 2, 1994, continuation of Ser. No. 176,750, Jan. 3, 1994, abandoned, which is a continuation-in-part of Ser. No. 27,620, Mar. 5, 1993, abandoned.

[51] Int. Cl.$^6$ .................................................. C25D 1/04
[52] U.S. Cl. .................... 205/77; 205/111; 205/125; 427/96; 427/209; 156/151
[58] Field of Search ................... 156/151; 427/209, 427/96; 205/76, 77, 78, 125, 111

[56] References Cited

U.S. PATENT DOCUMENTS

| | | | |
|---|---|---|---|
| Re. 29,820 | 10/1978 | Konicek | 216/20 |
| Re. 30,180 | 12/1979 | Wolski et al. | 428/601 |
| 2,865,830 | 12/1958 | Zoldas | 204/208 |
| 3,220,897 | 11/1965 | Conley et al. | 428/606 |
| 3,293,109 | 12/1966 | Luce et al. | 428/556 |
| 3,328,275 | 6/1967 | Waterbury | 205/111 |
| 3,674,656 | 7/1972 | Yates | 205/50 |
| 3,857,681 | 12/1974 | Yates | 428/554 |
| 3,984,598 | 10/1976 | Sarazin et al. | 428/336 |
| 4,323,632 | 4/1982 | Berdan et al. | 428/626 |
| 4,394,419 | 7/1983 | Konicek | 428/416 |
| 4,456,508 | 6/1984 | Torday et al. | 928/612 |
| 4,468,293 | 8/1984 | Polan et al. | 428/612 |

(List continued on next page.)

FOREIGN PATENT DOCUMENTS

| | | |
|---|---|---|
| 0250195 | 12/1987 | European Pat. Off. . |
| 0570094 | 11/1993 | European Pat. Off. . |
| 57-20347 | 2/1982 | Japan . |
| 5082590 | 4/1993 | Japan . |

OTHER PUBLICATIONS

International Search Report for PCT/US94/02309.

*Primary Examiner*—Jey Tsai
*Assistant Examiner*—Brendan Mee
*Attorney, Agent, or Firm*—Wolf, Greenfield & Sacks, P.C.

[57] ABSTRACT

Drum or smooth side-treated metal foil can be used either as an intermediate product for use in the manufacture of laminate or as a part of the finished laminate to be used in the manufacture of multi-layer printed circuit board (PCB) packages. By treating the drum or smooth side of metal foil with a bond strength enhancer rather than treating the matte side or rough side, or both sides, several time-consuming and costly steps can be bypassed in the manufacture of multi-layer printed circuit boards (PCB) while the integrity of the metal foil, -laminate and multi-layer PCB are not compromised and are actually enhanced by way of improved impedance control and adhesion characteristics after relamination. This novel foil can be initially bonded to substrate on either side before circuit formation and can be used either as an internal foil layer or as a foil cap. The invention includes methods of manufacture of the metal foil, laminate and multi-layer printed circuit board. A variation of the invention involves a component or tool for use in manufacturing articles such as printed circuit boards. The component is a temporary laminate constructed of one or more sheets of drum-side-treated copper foil mounted on a sheet of aluminum. The copper foil, which, in a finished printed circuit board, will constitute a functional element, has a drum-side, which has been subjected to an adhesion-promoting treatment, and a rough side, which has not been subject to the adhesion-promoting treatment. The sheet of aluminum constitutes a discardable or reusable element. Either surface (treated drum-side or untreated matte side) of each copper sheet can be bonded to the aluminum, depending on which embodiment of the basic invention is being used. The side of the copper foil not bonded to the aluminum will be bonded to the resin in the next step.

15 Claims, 15 Drawing Sheets

U.S. PATENT DOCUMENTS

| | | | |
|---|---|---|---|
| 4,469,567 | 9/1984 | Torday et al. | 205/250 |
| 4,515,671 | 5/1985 | Polan et al. | 205/228 |
| 4,572,768 | 2/1986 | Wolski et al. | 205/111 |
| 4,789,438 | 12/1988 | Polan | 205/50 |
| 4,997,516 | 3/1991 | Adler | 216/101 |
| 5,049,221 | 9/1991 | Wada et al. | 156/151 |
| 5,153,050 | 10/1992 | Johnston | 428/209 |
| 5,181,770 | 1/1993 | Brock et al. | 205/77 |
| 5,207,889 | 5/1993 | Wolski et al. | 205/155 |
| 5,230,932 | 7/1993 | Chen et al. | 428/607 |
| 5,262,247 | 11/1993 | Kajiwara et al. | 428/607 |
| 5,437,914 | 8/1995 | Saida et al. | 428/209 |
| 5,447,619 | 9/1995 | Wolski | 205/50 |

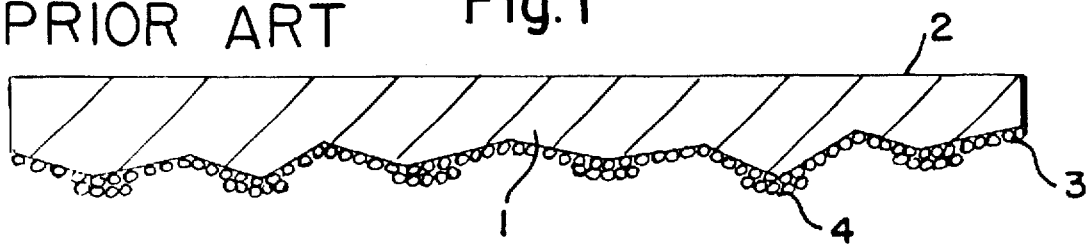
PRIOR ART Fig.1
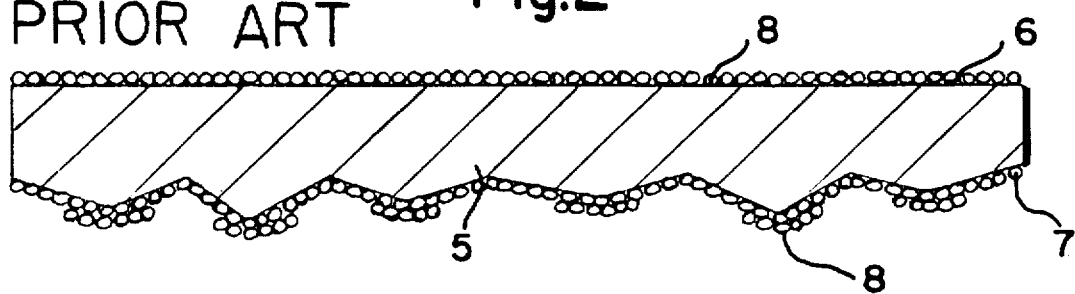
PRIOR ART Fig.2
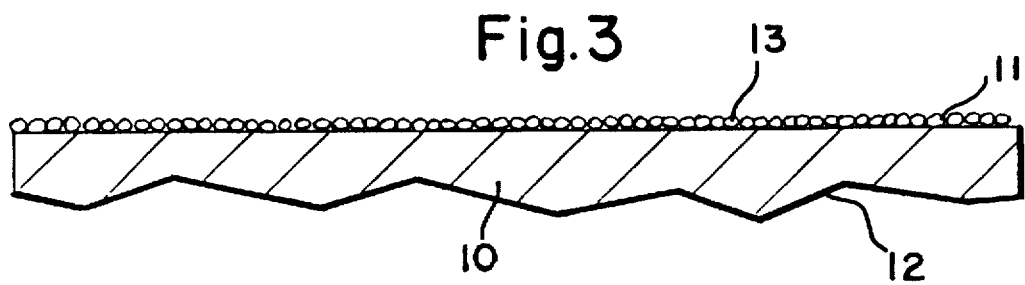
Fig.3

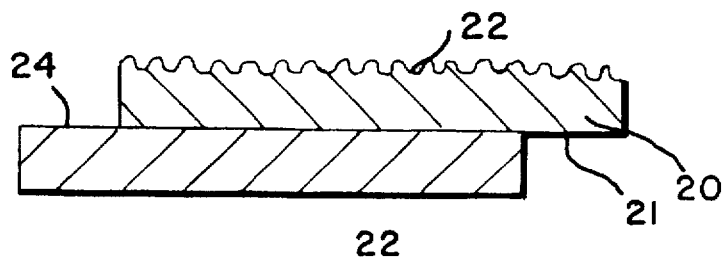
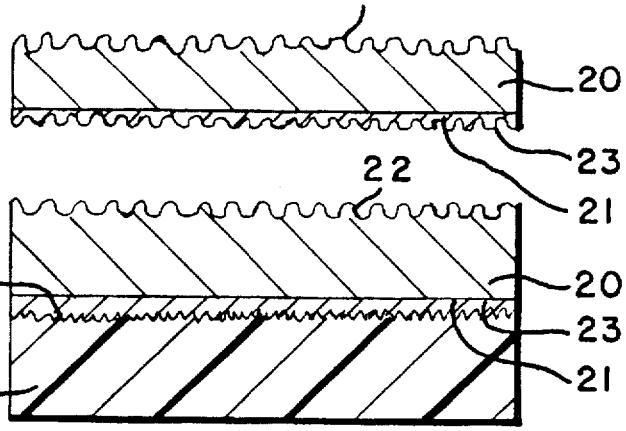
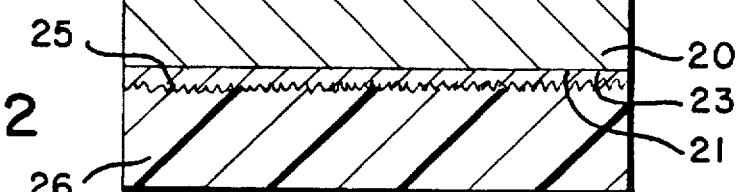
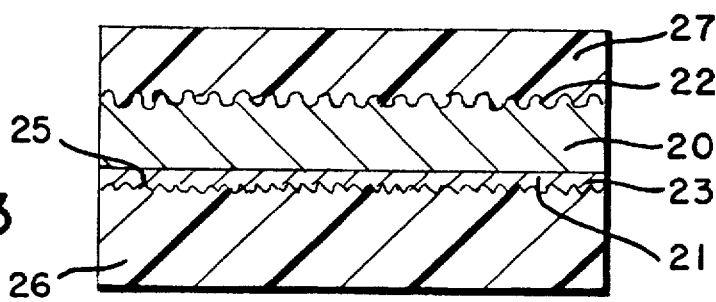
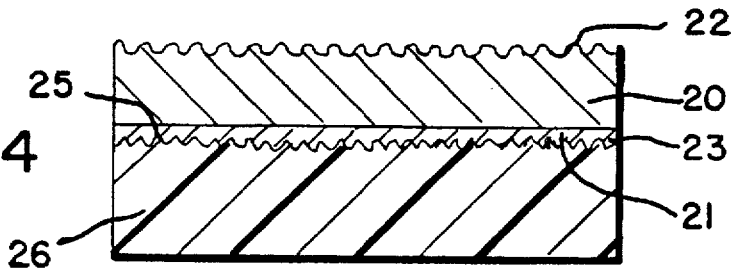
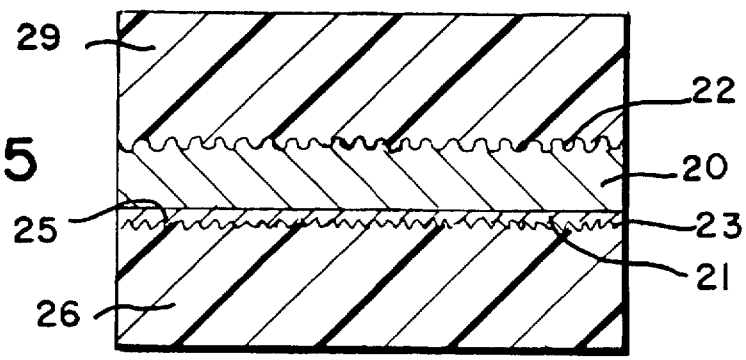

TABLE 1

INVENTION VS REGULAR SINGLE TREAT FOIL YIELDS
DATA COLLECTION PERIOD: JAN-MAR 1995

| COMPLEXITY GRADE | FOIL TYPE | TOTAL INSPECTED | FIRST PASS ACCEPTED | FIRST PASS YIELD | % IMPROVEMENT REG TO NEW |
|---|---|---|---|---|---|
| A | REG | 15348 | 14338 | 93.4% | |
| A | NEW | 9948 | 9646 | 97.0% | 3.8% |
| B | REG | 2843 | 2484 | 94.0% | |
| B | NEW | 37271 | 35169 | 94.4% | 0.4% |
| C | REG | 65050 | 62202 | 95.6% | |
| C | NEW | 20444 | 19752 | 96.6% | 1.0% |

DEFINITION OF COMPLEXITY GRADES:
A: ETCHED LINE & SPACE DEFINITION FINER THAN 0.006 INCHES
B: ETCHED LINE & SPACE DEFINITION BETWEEN 0.006 AND 0.0079 INCHES INCLUSIVE
C: ETCHED LINE & SPACE DEFINITION BETWEEN 0.008 AND 0.014 INCHES INCLUSIVE

FIG.45

TABLE 2

INVENTION VS REGULAR FOIL YIELDS
SOURCE: POLYCLAD TECHNICAL SERVICE FILES

| CASE STUDY # | FOIL TYPE | TOTAL INSPECTED | FIRST PASS ACCEPTED | FIRST PASS YIELD | % IMPROVEMENT REG TO NEW |
|---|---|---|---|---|---|
| 1 | REG | 5367 | 4589 | 85.5% | 10.3% |
|   | NEW | 70 | 66 | 94.3% |  |
| 2 | REG | 282 | 195 | 69.1% | 20.8% |
|   | NEW | 158 | 132 | 83.5% |  |
| 3 | REG | 217 | 185 | 85.2% | 16.0% |
|   | NEW | 240 | 237 | 98.8% |  |
| TOTAL | REG | 5866 | 4969 | 84.7% | 9.8% |
|   | NEW | 468 | 435 | 93.0% |  |

FIG. 46

| TABLE 3A |
|---|
| PWB INNERLAYER CHEMICAL PROCESS STEPS |
| TYPICAL REGULAR COPPER FOIL WET PROCESS STEPS |
| 1 MICROETCH |
| 2 RINSE |
| 3 PUMICE SCRUB |
| 4 RINSE |
| 5 DRY |
| 6 PHOTORESIST DEVELOP |
| 7 RINSE |
| 8 ETCH |
| 9 RINSE |
| 10 PHOTORESIST STRIP |
| 11 RINSE |
| 12 DRY |
| 13 CAUSTIC CLEANER |
| 14 RINSE |
| 15 MICROETCH |
| 16 SPRAY RINSE |
| 17 DIP RINSE |
| 18 ACID DIP |
| 19 RINSE |
| 20 PRE-OXIDE DIP |
| 21 OXIDE DIP |
| 22 RINSE |
| 23 OXIDE REDUCTION DIP |
| 24 RINSE |
| 25 DRY |

FIG.47

TABLE 3B

PWB INNERLAYER CHEMICAL PROCESS STEPS

TYPICAL
INVENTION WET
PROCESS STEPS
1. PHOTORESIST DEVELOP
2. RINSE
3. ETCH
4. RINSE
5. PHOTORESIST STRIP
6. RINSE
7. DRY
8. ACID CLEANER
9. RINSE
10. PRE-OXIDE DIP
* 11. OXIDE DIP
12. RINSE
** 13. OXIDE REDUCTION DIP
** 14. RINSE
15. DRY

\* CHEMICAL CONCENTRATION REDUCED BY 50% FROM REGULAR FOIL PROCESS
\*\* REPEATED EXPERIMENTATION SHOWS THESE STEPS CAN BE ELIMINATED

FIG.48

| TABLE 3C |
|---|
| PWB INNERLAYER CHEMICAL PROCESS STEPS |
| TYPICAL<br>INVENTION WITH PERM. PHOTO-<br>RESIST PROCESS STEPS<br>1 PHOTORESIST DEVELOP<br>2 RINSE<br>3 ETCH<br>4 RINSE<br>5 DRY |

FIG.49

METHOD OF MANUFACTURING LAMINATES AND PRINTED CIRCUIT BOARDS

REFERENCE TO RELATED APPLICATIONS

This application is a continuation-in-part of co-pending International application Ser. No. PCT/US94/02309 designating the United States of America, filed 2 Mar. 1994, which was a continuation of U.S. patent application Ser. No. 08/176,750, filed 3 Jan. 1994, now abandoned, which was a continuation-in-part of U.S. patent application Ser. No. 08/027,620, filed 5 Mar. 1993 now abandoned. Other related U.S. patent applications are: Ser. No. 08/359,019, filed 19 Dec. 1994, now abandoned; Ser. No. 08/420,437, filed 10 Apr. 1995 now abandoned; Ser. No. 08/480,585, filed 7 Jun. 1995 now abandoned; and International application No. PCT/US96/05148, filed 12 Apr. 1996.

FIELD OF INVENTION

Drum or smooth side-treated metal foil can be used either as an intermediate product for use in the manufacture of laminate or as a part of the finished laminate to be used in the manufacture of multi-layer printed circuit board (PCB) packages. By treating the drum or smooth side of metal foil with a bond strength enhancer rather than treating the matte side or rough side, or both sides, several time-consuming and costly steps can be bypassed in the manufacture of multi-layer printed circuit boards (PCB) while the integrity of the metal foil, laminate and multi-layer PCB are not compromised and are actually enhanced by way of improved impedance control and adhesion characteristics after relamination. This novel foil can be initially bonded to substrate on either side before circuit formation and can be used either as an internal foil layer or as a foil cap. The invention includes methods of manufacture of the metal foil, laminate and multi-layer printed circuit board.

BACKGROUND OF THE INVENTION

Metal foil, primarily copper foil, has long been manufactured for use in printed circuit boards. Of the various types of metal foil used, electrodeposited foil is the most common. Electrodeposited copper foil is electroplated from a copper plating solution onto a revolving drum, typically, with a titanium or stainless steel surface acting as the cathode in the plating process. The matte side, or side away from the drum surface of electrodeposited foil is rough which enhances the adhesive strength, especially when coupled with subsequent adhesion enhancing treatments. The drum side of the electroplated foil is very smooth, and has a shiny appearance, and is regarded as a poor adhesion surface.

Typical adhesion promoting treatments consist of plating additional copper and zinc onto the matte side of the foil. Other agents such as silanes are also being used. The "adhesion promoting treatment" which is preferred by the copper foil industry at the time that this patent application was filed, and which is, therefore, the preferred embodiment, involves electroplating processes which form nodular or dendritic particles, usually of copper, on the surface of the treated foil. This type of "adhesion promoting treatment" is described in the following U.S. patents: Zoldas, U.S. Pat. No. 2,865,830; Conley et al., U.S. Pat. No. 3,220,897; Waterbury, U.S. Pat. No. 3,328,275; Luce et al., U.S. Pat. No. 3,293,109; Yates, U.S. Pat. No. 3,674,656; Yates, U.S. Pat. No. 3,857,681; Wolski et al., U.S. Pat. No. Re. 30,180; Torday et al., U.S. Pat. No. 4,456,508; Polan et al., U.S. Pat. No. 4,515,671; Wolski et al., U.S. Pat. No. 4,572,768; Adler, U.S. Pat. No. 4,997,516; Wolski et al., U.S. Pat. No. 5,207,889. The foil is then processed through a stain proofing solution to act as an oxidation retardant of the metal surface.

An alternate foil product which has also been manufactured historically is what is known in the circuit board industry as "double-treat" metal foil. This foil is electroplated identically to what is described in the preceding paragraphs but it is typically run through the adhesion promoting treating line a second time and plated with additional adhesion promoters on the drum or shiny side of the foil. The purpose of this product is to replace a subsequent step known as the oxidizing process in the manufacture of printed circuit boards. Problems with this double-treat product are extremely common at each of the discrete steps in the circuit board process, namely, at the metal foil manufacturer step, the laminate manufacturer step and the multi-layer printed circuit board (PCB) manufacturer step. The double-treat metal foil typically has a much higher scrap rate than single side treated foils and additional processing steps are required, thus increasing both cycle times and costs. At the laminate and PCB manufacturer, handling problems can drive scrap rates to unacceptably high levels. The problem is so significant that only a very limited number of manufacturers will even attempt to use this double-treat product.

The foil-and-substrate laminate for use in the printed circuit board industry can be constructed from a variety of substrates including paper, glass, and TEFLON. These substrates are coated or impregnated in a continuous fashion with a resin system to facilitate adhesion with the metal foil which will subsequently be clad to the substrate on one or both sides in a process referred to in the PCB industry as pressing. This unclad substrate shall be referred to as prepreg.

Both the prepreg and the metal foil are typically sheeted although technology does exist for "continuous lamination". The laminate can be manufactured with either single or multiple plies of prepreg which will result in various thicknesses as dictated by customer and/or design criteria. The prepreg and metal foil are bonded together by means of heat and pressure under controlled conditions which depend on the required product properties.

The pressed units, referred to in the industry as laminates, must then have the edges trimmed off. Oftentimes, smaller units are fabricated from the pressed unit. These steps require additional handling and any minor surface damage may result in the rejection of laminate clad with "double treat" metal foil. This minor surface damage is typically aesthetic only and will not negatively affect the functionality of the finished printed circuit board. Minor surface damage on single side treated metal foil can be masked by a subsequent processing step referred to as oxidizing, thus resulting in higher processing yields.

The next typical step of multi-layer PCB manufacture is to remove the oxidation retardant, which was applied by the metal foil manufacturer. This removal is accomplished by means of a mild acid cleaner, a mechanical scrubbing of the surface or a combination of both. In the industry, this step is referred to as the scrubbing or cleaning process.

Next, the cleaned panel is laminated with a polymeric light sensitive photo resist. An image is printed onto the photo resist by means of exposure to intense light under controlled conditions. The unexposed film is then chemically removed from the metal surface and the now exposed metal surface is chemically etched off. The remaining photo resist is stripped off through additional chemical processing.

The result is a pattern of conductive lands separated by insulative grooves to form a printed circuit.

These etched laminates, hereafter referred to as inner layers, are inspected for defects in the metal circuitry and the substrate. This inspection typically is done by automated optical inspection equipment commonly referred to as AOI. The technologies for various brands of AOI equipment differ. Some equipment inspects the substrate surface to detect flaws, others use a reflective technology where the metal foil surface is inspected for flaws. One problem experienced by all users of reflective technology is that when any oxidation occurs on the metal surface, it is detected as a flaw. After the automated inspection, human operators verify all defects. Almost more times than not, a flaw detected by the AOI equipment is not a functional flaw and the human verifier will accept the inner layer.

After inspection, the inner layers will undergo an additional chemical process known in the industry as the oxidizing process. Under current industry practices, the typical inner layer has the drum or smooth side of the metal exposed to the environment and the matte or rough side imbedded within the prepreg. This smooth outer surface alone does not offer sufficient surface topography to allow for subsequent relamination with acceptable adhesion characteristics. The purpose of the oxidizing process is to "grow", under controlled conditions, an oxide crystal layer which is designed to increase the surface area and thus create acceptable adhesion characteristics, on the smooth surface, for the subsequent relamination process.

An optional, but widely used and expensive final step of the oxide process, is a post dip bath which essentially reduces the valence of the copper to a +1 from a +2 state. The benefit achieved from this is the elimination of what is known as "pink ring", a term widely used in the industry. Pink ring is the dissolution of the copper oxide around drilled holes, forming a pink ring of exposed, bare copper. It is cause for rejection of the part.

A typical oxide process consists of many different chemical baths including but not limited to one or more cleaning baths, a microetch bath to aid in increasing surface topography, an oxide bath where the oxide crystals are actually formed and numerous pre-dip and rinse baths, followed by a post-dip, reduction bath. This process is difficult to optimize, expensive to operate and extremely time consuming. As noted previously, laminate which is clad with "double treat" metal foil does not require this processing step.

After this operation, oxided inner layers (or inner layers clad with double treated metal foil) are ready to be combined with additional prepreg material laminated on both sides (and additional inner layers if required) and generally, clad on the outermost surfaces with additional metal foil. This package will be heated and pressed in a similar fashion to that of the laminate manufacture described above. Among the critical characteristics of this semifinished multi-layer printed circuit board is the ability of the many different components used in its manufacture to remain firmly bonded together. The adhesion strength of both the metal foil treatment and the oxide play integral roles in the reliable life of a multi-layer printed circuit board. Typically, the weakest link in this package is the oxide adhesion to the relamination prepreg. This weak point many times results in product failure in the field. These and other difficulties experienced with the prior art devices have been obviated in a novel manner by the present invention.

It is an object of the present invention to provide a product which can reduce multilayer printed circuit board manufacture cycle time through the elimination of several manufacturing steps. A direct consequence of this objective is the reduction in costs associated with the manufacture of multi-layer printed circuit boards.

A second, equally important objective of the present invention is to improve the reliability of the overall multi-layer circuit board package. By strengthening the weakest adhesion link which exists in today's technology, the oxide, the finished product will be less prone to delamination when operating in harsh conditions or normal conditions for long periods of time.

One additional consideration was taken into account as an objective of the invention. This is the systematic reduction of chemical processes required in the manufacture of multi-layer printed circuit boards. This objective will reduce the amount of hazardous waste generated by all circuit board shops which will utilize this means of manufacture. Additional direct costs will be reduced and regulatory fees should also decline. Our environment will also benefit as a result.

With these and other objects in view, as will be apparent to those skilled in the art, the invention resides in the combination of parts set forth in the specification and covered by the claims appended hereto.

SUMMARY OF THE INVENTION

Drum or smooth side-treated metal foil can be used either as an intermediate product for use in the manufacture of laminate or as a part of the finished laminate to be used in the manufacture of multi-layer printed circuit board (PCB) packages. By treating the drum or smooth side of metal foil with a bond strength enhancer rather than treating the matte side or rough side, or both sides, several time-consuming and costly steps can be bypassed in the manufacture of multi-layer printed circuit boards (PCB) while the integrity of the metal foil, laminate and multiple layer PCB are not compromised and are actually enhanced by way of improved impedance control and adhesion characteristics after relamination. This novel foil can be initially bonded to substrate on either side before circuit formation and can be used either as an internal foil layer or as a foil cap. The invention includes methods of manufacture of the metal foil, laminate and multiple layer printed circuit board.

A variation of the invention involves a component or tool for use in manufacturing articles such as printed circuit boards. The component is a temporary laminate constructed of one or more sheets of drum-side-treated copper foil mounted on a sheet of aluminum. The copper foil, which, in a finished printed circuit board, will constitute a functional element, has a drum-side, which has been subjected to an adhesion-promoting treatment, and a rough side, which has not been subject to the adhesion-promoting treatment. The sheet of aluminum constitutes a discardable or reusable element. Either surface (treated drum-side or untreated matte side) of each copper sheet can be bonded to the aluminum, depending on which embodiment of the basic invention is being used. The side of the copper foil not bonded to the aluminum will be bonded to the resin in the next step.

It should be understood that, although the foil will sometimes be designated as copper herein, because copper is the most common material from which to form the foil, any electrically conductive sheet material, including copper alloys, are encompassed by the disclosure.

BRIEF DESCRIPTION OF THE DRAWINGS

The character of the invention, however, may be best understood by reference to one of its structural forms, as illustrated by the accompanying drawings, in which:

FIG. 1 is a diagrammatic sectional view of a foil treated in the "single-treat" method of the prior art.

FIG. 2 is a diagrammatic sectional view of a foil treated in the "double-treat" method of the prior art.

FIG. 3 is a diagrammatic sectional view of a foil embodying the principles of the present invention.

FIG. 10 is a diagrammatic sectional view of a step in a second embodiment of the process of the present invention in which the foil is formed on a smooth surface.

FIG. 11 is a diagrammatic sectional view of a step in a second embodiment of the process of the present invention in which the smooth side of the foil is treated with an adhesion enhancing plating.

FIG. 12 is a diagrammatic sectional view of a step in a second embodiment of the process of the present invention in which the treated smooth surface of the foil is bonded to a substrate.

FIG. 13 is a diagrammatic sectional view of a step in a second embodiment of the process of the present invention in which the matte surface of the foil is coated with photo resist without the need for a prior scrubbing process.

FIG. 14 is a diagrammatic sectional view of a step in a second embodiment of the process of the present invention in which the photo resist has been removed from the matte surface. It will be understood by those skilled in the art that if this foil is a cap or outside foil layer, it would now be complete, without the next step.

FIG. 15 is a diagrammatic sectional view of a step in a second embodiment of the process of the present invention in which a second substrate is bonded to the unoxidized matte side of the foil.

FIG. 23 shows cross-sectional view of a single-sided tool 50 of the present invention, with the untreated matte side of the foil 52 toward the plate 51.

FIG. 24 shows a variation of the tool shown in FIG. 23, the variation being that the tool 60 in FIG. 24 has the treated drum-side of the foil toward the plate 61.

FIG. 25 shows cross-sectional view of a double-sided tool 70 of the present invention, with the untreated matte side of the foil 72' and 72" toward the plate 71.

FIG. 26 shows a variation of the tool shown in FIG. 25, the variation being that the tool 80 in FIG. 26 has the treated drum-sides of the foils toward the plate 81.

FIGS. 27–32 show a fourth embodiment of the process of the present invention.

FIG. 27 shows a step in which the foil 110 is formed on a smooth surface 114.

FIG. 28 shows a step in which the smooth side 111 of the foil 110 is treated with an adhesion enhancing plating 113, and the matte side 112 of the foil 110 is mounted on the tool 101.

FIG. 29 shows a step in which the treated smooth surface 111 of the foil 110 is bonded to a first surface 115 of a substrate 116, and then the tool 101 is removed from the foil 110.

FIG. 30 shows a step in which the matte surface 112 of the foil 110 is coated with photo resist 117 without the need for a prior scrubbing process.

FIG. 31 shows a step in which the matte surface 112, from which the photo resist has been removed, is treated with an oxidizing process, to form an oxide layer 118, without the need for a prior microetch and rinse process.

FIG. 32 shows a step in which a second substrate 119 is bonded to the oxidized matte side 112 of the foil 110.

FIGS. 33–38 show a fifth embodiment of the process of the present invention.

FIG. 33 shows a step in which the foil 120 is formed on a smooth surface 124.

FIG. 34 shows a step in which the smooth side 121 of the foil 120 is treated with an adhesion enhancing plating 123, and the matte side 122 of the foil 120 is mounted on tool sheet 102 or plate, preferably of aluminum.

FIG. 35 shows a step in which the treated smooth surface 121 of the foil 120 is bonded to a first surface 125 of a substrate 126 after which the tool 102 can be removed.

FIG. 36 shows a step in which the matte surface 122 of the foil 120 is coated with photo resist 127 without the need for a prior scrubbing process.

FIG. 37 shows a step in which the photo resist 127 has been removed from the matte surface 122.

FIG. 38 shows a step in which a second substrate 129 is bonded to the untreated and unoxidized matte side 122 of the foil 120.

FIGS. 39–44 show a sixth embodiment of the process of the present invention.

FIG. 39 shows a step in which the foil 130 is formed on a smooth surface 134.

FIG. 40 shows a step in which the smooth side 131 of the foil 130 is treated with an adhesion enhancing plating 133, and then the treated smooth side 131 of the foil 130 is bonded to a tool 103.

FIG. 41 shows a step in which the untreated matte surface 132 of the foil 130 is bonded to a first surface 135 of a substrate 136, after which, the tool 103 is removed.

FIG. 42 shows a step in which the treated smooth surface 131 of the foil 130 and plated layer 133 are coated with photo resist 137 without the need for a prior scrubbing process.

FIG. 43 shows a step in which the photo resist 137 has been removed from the treated smooth surface 131, and FIG. 44 shows a step in which a second substrate 139 is bonded to the treated smooth side 131 of the foil 130.

FIG. 45 is Table 1.

FIG. 46 is Table 2.

FIG. 47 is Table 3A.

FIG. 48 is Table 3B, and

FIG. 49 is Table 3C.

DESCRIPTION OF THE PREFERRED EMBODIMENT

Figure 4:
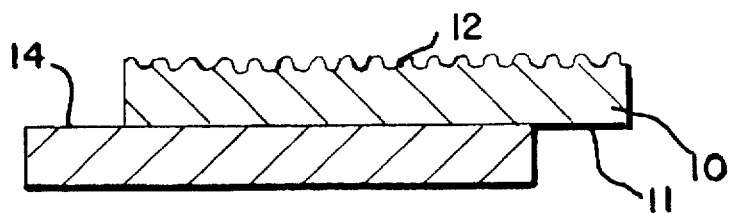
FIG. 4 is a diagrammatic sectional view of a step in a first embodiment of the process of the present invention in which the foil is formed on a smooth surface.

The details of the invention, however, may be best understood by reference to its three structural forms, as illustrated by the accompanying drawings. The first embodiment is characterized by an oxidized matte surface facing out, and is shown in FIGS. 4–9. The second embodiment is characterized by an unoxidized matte surface facing out, and is shown in FIGS. 10–15. The third embodiment is characterized by a treated smooth surface facing out, and is shown in FIGS. 16–21. Each embodiment has two subembodiments; one in which the foil ends up sandwiched within a multi-layer PCB, and a second in which the foil ends up as a cap or outer foil layer on the outer surface of the PCB. The cap subembodiment would apply to both single- and double-sided (clad) PCB's, which are not considered "multilayer" PCB's.

FIGS. 1–21 are diagrammatic sectional views of various foils and the steps in various processes. FIG. 1 shows a foil treated in the "single-treat" method of the prior art. The foil 1 has a smooth side 2 and a matte side 3. The matte side 3 is treated by plating with copper-zinc particles 4. FIG. 2 shows a foil treated in the "double-treat" method of the prior art. The foil 5 has a smooth side 6 and a matte side 7. Both the smooth side 6 and the matte side 7 are treated by plating with copper-zinc particles 8. FIG. 3 shows a foil embodying the principles of the present invention. The foil 10 has a smooth side 11 and a matte side 12. The smooth side 11 is treated by plating with copper-zinc particles 13.

Figure 5:
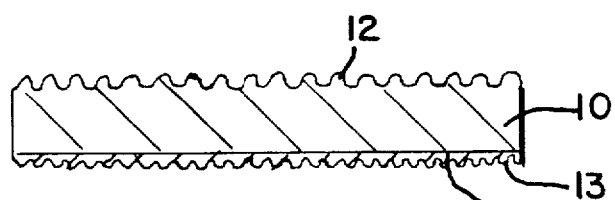
FIG. 5 is a diagrammatic sectional view of a step in a first embodiment of the process of the present invention in which the smooth side of the foil is treated with an adhesion enhancing plating.
Figure 6:
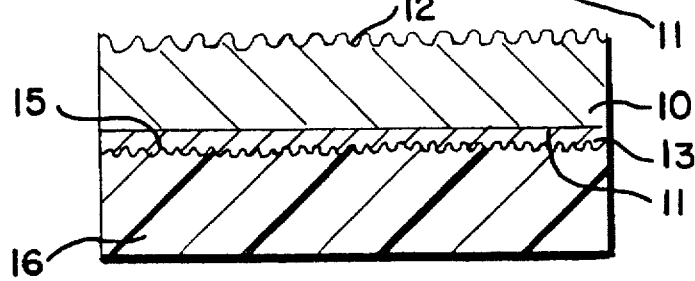
FIG. 6 is a diagrammatic sectional view of a step in a first embodiment of the process of the present invention in which the treated smooth surface of the foil is bonded to a substrate.
Figure 7:
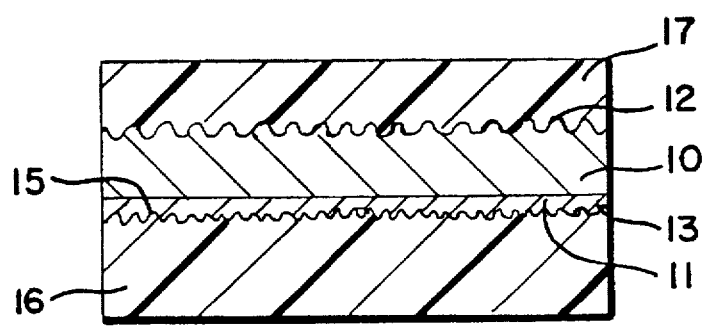
FIG. 7 is a diagrammatic sectional view of a step in a first embodiment of the process of the present invention in which the matte surface of the foil is coated with photo resist without the need for a prior scrubbing process.
Figure 8:
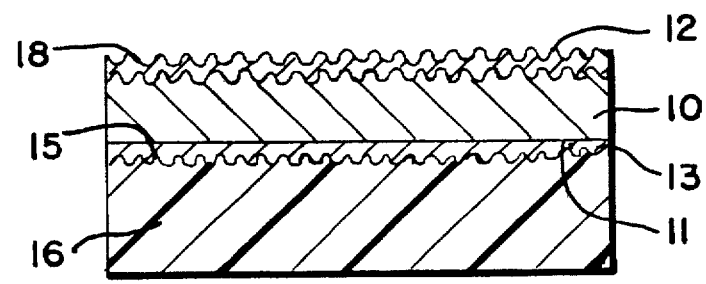
FIG. 8 is a diagrammatic sectional view of a step in a first embodiment of the process of the present invention in which the matte surface, from which the photo resist has been removed, is treated with an oxidizing process without the need for a prior microetch and rinse process.
Figure 9:
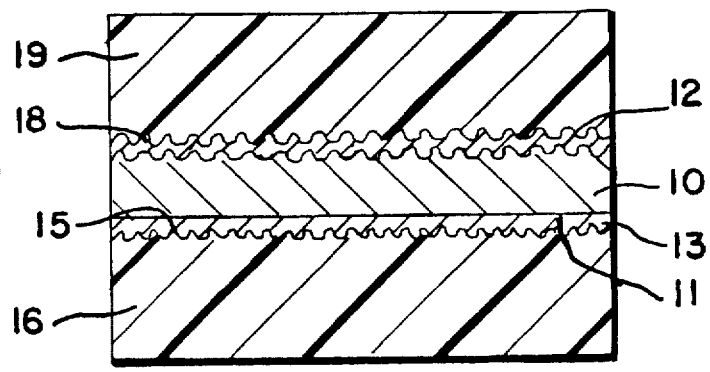
FIG. 9 is a diagrammatic sectional view of a step in a first embodiment of the process of the present invention in which a second substrate is bonded to the oxidized matte side of the foil.

FIG. 4 shows a step in a first embodiment of the process of the present invention in which the foil 10 is formed on a smooth surface 14. FIG. 5 shows a step in which the smooth side 11 of the foil is treated with an adhesion enhancing plating 13. FIG. 6 shows a step in which the treated smooth surface 11 of the foil 10 is bonded to a first surface 15 of a substrate 16. FIG. 7 shows a step in which the matte surface 12 of the foil 10 is coated with photo resist 17 without the need for a prior scrubbing process. FIG. 8 shows a step in which the matte surface 12, from which the photo resist has been removed, is treated with an oxidizing process, to form an oxide layer 18, without the need for a prior microetch and rinse process. It will be understood by those skilled in the art that if this foil is a cap or outside foil layer, it would not need the oxidizing treatment and would be complete without it and without the next step. FIG. 9 shows a step in which a second substrate 19 is bonded to the oxidized matte side 12 of the foil 10.

FIG. 10 shows a step in a second embodiment of the process of the present invention in which the foil 20 is formed on a smooth surface 24. FIG. 11 shows a step in which the smooth side 21 of the foil 20 is treated with an adhesion enhancing plating 23. FIG. 12 shows a step in which the treated smooth surface 21 of the foil 20 is bonded to a first surface 25 of a substrate 26. FIG. 13 shows a step in which the matte surface 22 of the foil 20 is coated with photo resist 27 without the need for a prior scrubbing process. FIG. 14 shows a step in which the photo resist 27 has been removed from the matte surface 22. It will be understood by those skilled in the art that if this foil is a cap or outside foil layer, you would not have a subsequent relamination over this layer, so the next step would not be necessary. FIG. 15 shows a step in which a second substrate 29 is bonded to the untreated and unoxidized matte side 22 of the foil 20.

Figure 16:
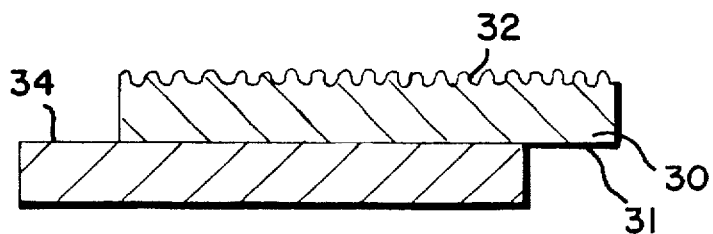
FIG. 16 is a diagrammatic sectional view of a step in a third embodiment of the process of the present invention in which the foil is formed on a smooth surface.
Figure 17:
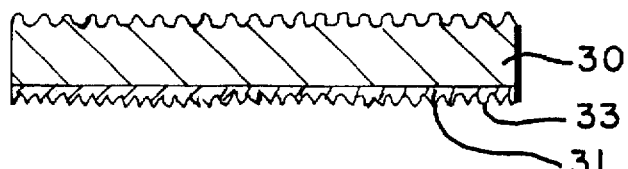
FIG. 17 is a diagrammatic sectional view of a step in a third embodiment of the process of the present invention in which the smooth side of the foil is treated with an adhesion enhancing plating.
Figure 18:
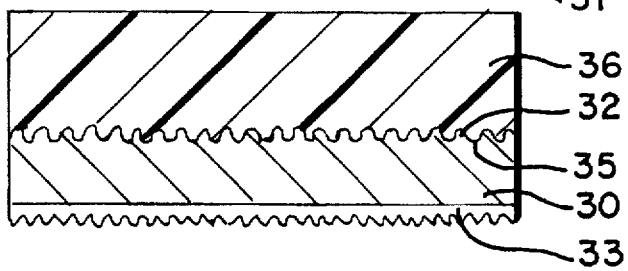
FIG. 18 is a diagrammatic sectional view of a step in a third embodiment of the process of the present invention in which the untreated matte surface of the foil is bonded to a substrate.
Figure 19:
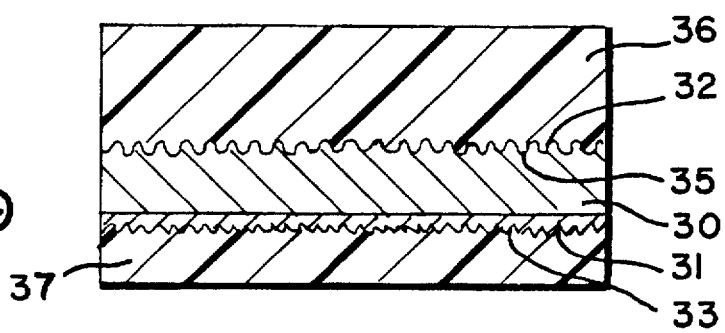
FIG. 19 is a diagrammatic sectional view of a step in a third embodiment of the process of the present invention in which the treated smooth surface of the foil is coated with photo resist without the need for a prior scrubbing process.
Figure 20:
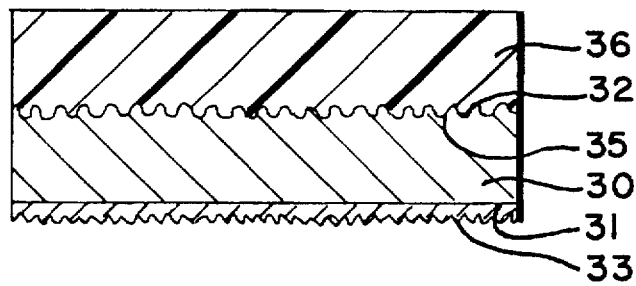
FIG. 20 is a diagrammatic sectional view of a step in a third embodiment of the process of the present invention in which the photo resist has been removed from the matte surface. It will be understood by those skilled in the art that if this foil is a cap or outside foil layer, it would now be complete, without the next step.
Figure 21:
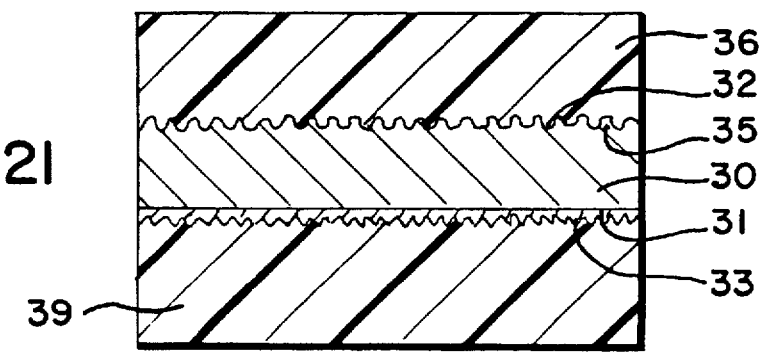
FIG. 21 is a diagrammatic sectional view of a step in a third embodiment of the process of the present invention in which a second substrate is bonded to the treated smooth side of the foil.

FIG. 16 shows a step in a third embodiment of the process of the present invention in which the foil 30 is formed on a smooth surface 34. FIG. 17 shows a step in which the smooth side 31 of the foil 30 is treated with an adhesion enhancing plating 33. FIG. 18 shows a step in which the untreated matte surface 32 of the foil 30 is bonded to a first surface 35 of a substrate 36. FIG. 19 shows a step in which the treated smooth surface 31 of the foil 30 is coated with photo resist 37 without the need for a prior scrubbing process. FIG. 20 shows a step in which the photo resist 37 has been removed from the treated smooth surface 31. It will be understood by those skilled in the art that if this foil is a cap or outside foil layer, you would not have a subsequent relamination over this layer, so the next step would not be necessary. FIG. 21 shows a step in which a second substrate 39 is bonded to the treated smooth side 31 of the foil 30.

In inventing a system which achieves the objectives of the present invention, processability was constantly emphasized. The manufacture of the untreated metal foil is identical to current technology. The adhesion promoting treatment chemistry and oxidation retardant treatments are also the same. The primary difference is the application of said adhesion promoting treatment. Current technology requires that the matte side of the metal foil be treated with the bond enhancers or, on "double treat" metal foil, both the matte and drum sides are treated with the bond enhancers. The present invention provides that only the drum side of the metal foil be treated with the bond enhancers. This is exactly opposite of current industry practices for single treat metal foils.

It is important to note that this change in the side of the foil that is treated requires no additional processing equipment or steps by the metal foil manufacturer to produce this product as opposed to existing matte side treated foil. This invention performs best with a "low profile" foil, a foil with the matte side Rz<10.2 microns as recognized by current industry standards. Very low profile foil (Rz<5.1 microns) and standard foil (no Rz requirement) also perform acceptably. Rz is the mean peak-to-valley height of the matte teeth.

The invention employs a single-side-treated metal foil where the adhesion enhancing treatment is applied only to the drum or smooth side of the foil. This is exactly opposite of current industry practices. See FIG. 3 for the invention and FIG. 1 and 2 for prior technology. Current industry practices of antioxidation treatment application would remain essentially identical.

This metal foil is used by a laminate manufacturer to produce a metal clad laminate for use, after circuit pattern formation, in the multi-layer printed circuit board industry. The laminate manufacturer will also continue to follow virtually identical processing steps as in the manufacture of single treat metal foil clad laminate. The laminator will press the treated drum surface of the foil against the prepreg in the lamination process. This is the only significant processing difference used in the lamination step of the process.

The printed circuit board manufacturer will experience several significant changes in existing processes. The first step which can be eliminated in the multi-layer process was described previously as the scrubbing or cleaning process, which normally takes place after the foil is bonded to the substrate and before the photo resist is deposited on the foil's outer surface. This step is completely eliminated with this invention. This is made possible because the exposed surface of the laminate of the present invention (either the treated smooth or untreated matte) has sufficient topography or texture to allow for the adhesion of the photo resist without requiring the removal of the antioxidation treatment. Subsequent benefits of the elimination of this scrubbing process will be discussed at the inspection step. It is important to note that the elimination of this step is a benefit in two separate situations. The first situation is the multi-layer situation in which the etched foil will be subsequently relaminated to form an inner foil layer. The other situation is when the etched foil is a foil cap, that is, it will be left to form the outer layer of the finished circuit board. This other situation applies to all three types of PCB's; multi-layer, double-layer, and single-layer.

From this point through the inspection process, there is one design advantage which has been noted in certain situations. In "double-treat" foil, the surface texture created by the adhesion enhancing plating process on the smooth side sometimes acts to degrade the resolution which can be consistently achieved in the chemical etching process. This degradation of resolution would be even more serious if the circuit formation were done on a so treated matte side. Thus, in the present invention, production quality of higher resolution circuit patterns is increased when the photo resist is laminated to the untreated matte surface of the foil. At the inner layer inspection operation, the number of false call outs by the AOI equipment using reflective technology will be greatly reduced since the metal surface will not oxidize as readily as in current industry practices. As the number of false call outs is reduced, the number of escapes by human verifiers will decrease as they will have less call outs to verify thus allowing them to concentrate on finding functional defects. Also, this benefit will allow PCB shops to experience added flexibility in scheduling and should reduce cycle time as well.

Another step in which the foil of the present invention offers advantage is in the elimination of the pre-oxidizing microetch and associated rinses. Conventionally, after the circuit pattern is etched through the shiny side of the foil, the shiny surface must be partially etched to give it sufficient texture to form a foundation for the subsequent oxidizing step. The untreated matte side has sufficient texture to allow oxidizing without need for the microetch and associated rinses, while the treated shiny side out does not require the oxidizing process, because of the treatment.

Another step in which the foil of the present invention offers advantage is the oxidizing step which is used in "single-treat" foil to prepare the originally shiny-side-out circuit pattern for subsequent bonding to another layer of prepreg or substrate. Either outer face of the foil of the present invention has been found, even without oxidizing to have sufficient adhesion properties to satisfy all but the most extreme specifications. Thus, there are applications where the oxidizing step can be eliminated.

In general, however, the oxidizing process would still be employed by PCB manufacturers who employ the foil of the invention, but several distinct benefits are achieved by the present invention. The first advantage is the complete elimination of the microetch bath and the rinse baths (typically two) associated with this microetch bath, as mentioned above. This results in the reduction of the volume of waste liquid and a reduction in the generation of hazardous waste.

The second advantage is the reduction of the amount of oxide crystal formation required to achieve bond strength equivalent to current industry practices and requirements. This results directly in lower chemical, material, and production costs and improved cycle time.

If the PCB manufacturer chooses to continue to maintain current dwell time in the oxide bath, adhesion improvements of greater than 40% have been achieved during experimentation with the present method. This essentially means that the overall reliability of the completed printed circuit board will be improved by over 40% in regards to delamination at the oxide/prepreg interface.

If the PCB manufacturer chooses to keep the adhesion strength between the oxide and the relamination prepreg at existing levels, experiments have shown a reduction in dwell time of 40% and a chemical consumption reduction of over 50%. Reduced costs and faster cycle times will yield results equal to current methods. -Another important advantage of the present invention when compared to the "double-treat" product results from the economic waste involved when a large amount of the adhesion enhancing plating on the shiny side is etched away in the circuit formation process. In the present process, even if oxidizing is necessary, it only occurs on the remaining circuit traces so that there is less waste of expensive surface treatment based on area treated.

Another advantage this product brings is the elimination of a post-dip reduction bath which follows the oxidation bath. Experiments have shown that the need for this chemical reduction process is no longer necessary in order to prevent "pink ring". Due to the matte surface on which the oxide crystals are formed, the leaching of acid in subsequent PCB manufacturing steps, is prevented. The removal of this step is significant as it is extremely hazardous (the mixture of reducing agents and oxidizing agents is highly volatile) and costly.

Another advantage of the embodiments of the invention in which the matte side is inward facing and oxidation requirements are eliminated, is the avoidance of a phenomena called "pink ring". A basis for rejection of a multi-layer circuit board can be that, when the board, with plated-through holes, is dipped in weak (10%) HCl, the acid leaches, from the hole, into the oxide layer that shows through the substrate, dissolves the oxide and allows a ring of copper to show through the substrate. By eliminating the outward-facing oxide layer, this basis for rejection is eliminated. The circuit board construction of the present invention has been found to have an additional advantage. A very important test of circuit board quality involves thermal cycling of the board until the board delaminates at one of the bond layers. Unexpectedly, the circuit boards employing the present invention were found to be more resistant to thermally-induced initial delamination than circuit boards of traditional construction. Upon investigation, it was determined that the bond between the oxided drum-side of the foil and the resin can sometimes have a tendency to weakness, delamination and, therefore, board failure. Both sides of the foil of the present invention form uniform and highly reliable bonds with the resin. This uniformity tends to eliminate the "weak link" or "failure point" found in traditional circuit boards.

Another embodiment of the present invention involves a concept which is a variation of a tooling concept and process described in U.S. Pat. No. 5,153,050, issued on October 6, 1992 to James A. Johnston, the disclosure of which is incorporated herein by reference. Simply stated, the Johnston concept involves temporarily adhering the drum-side or shiny-side of a sheet of conventional copper circuit-board foil to one or both sides of a disposable aluminum plate. The copper-aluminum (-copper) laminate would be assembled into a press lay-up or book, as end panels and separators (if both sides of the aluminum were foiled), in the formation of circuit boards. This tool structure would protect the drum-side of the copper foil from damage or contamination before and during the foil-to-resin lamination process. After the foil-to-resin lamination process is completed, the bond between the copper and aluminum is terminated and the aluminum is reused or discarded.

This concept can be combined with the basic concept of the present invention (single-treated-drum-side foil) to form a variation which offers some substantial and unexpected advantages.

Basically, this variation of the invention involves a component or tool for use in manufacturing articles such as printed circuit boards. The component is a temporary laminate constructed of one or more sheets of drum-side-treated copper foil mounted on a sheet of aluminum. The copper foil, which, in a finished printed circuit board, will constitute a functional element, has a drum-side, which has been subjected to an adhesion-promoting treatment, and a rough side, which has not been subject to the adhesion-promoting treatment. The sheet of aluminum constitutes a discardable or reusable element. Either surface (treated drum-side or untreated matte side) of each copper sheet can be bonded to the aluminum, depending on which embodiment of the basic invention is being used. The side of the copper foil not bonded to the aluminum will be bonded to the resin in the next step. The bonding agent which serves to join the surfaces of the copper and aluminum sheets together protects the interface from external contamination and damage and assures a substantially uncontaminated central zone inwardly of the edges of the sheets on one or both sides of the aluminum sheet. Very importantly, this temporary structure provides a very protective physical support for the foil. This expedites the handling of very thin or otherwise very delicate conductive foils. For example, this tool would allow handling of foil that is far to thin to be handled effectively by conventional means. This improved handlability would be particularly important in automated versions of the production of circuit boards. The ability to handle ultra-thin copper foil could significantly reduce the amount of copper that must be etched away to form the circuit paths and therefore would significantly reduce the amount of hazardous waste which results from the etching process.

A component or tool described above is employed in a method of manufacturing a copper and resin laminate, either as simple one or two foil-layer boards, as intermediate laminates, or as multi-layer boards. The process, set out in the flow chart in FIG. 22, begins which a group of pre-press steps, which can be performed in any of a number of sequences. These pre-press steps are 41) forming a tool sheet having a first surface, 42) forming a sheet of copper having a drum-side and a rough side, 43) subjecting the drum-side of the copper foil to an adhesion-promoting treatment, but not subjecting the rough side to an adhesion-promoting treatment, and 44) reversibly bonding one of the sides of the copper foil to one of the sides of the tool sheet to form a copper-clad tool.

Following the pre-press steps, the press steps are 45) positioning the copper foil, which is on the copper-clad tool, in contact with a resin layer in a laminating press, to form a stack of layers, and 46) applying laminating conditions to the copper-clad tool and resin layer to bond the copper foil to the resin layer. Following the press steps, the post-press step 47 involves terminating the bond between the tool sheet and the copper foil and separating the tool sheet from the copper foil, which is now laminated to the resin.

FIGS. 23–44 are diagrammatic sectional views of various foil-tool combinations and the steps in various processes involved it this variation of this invention.

Figure 22:
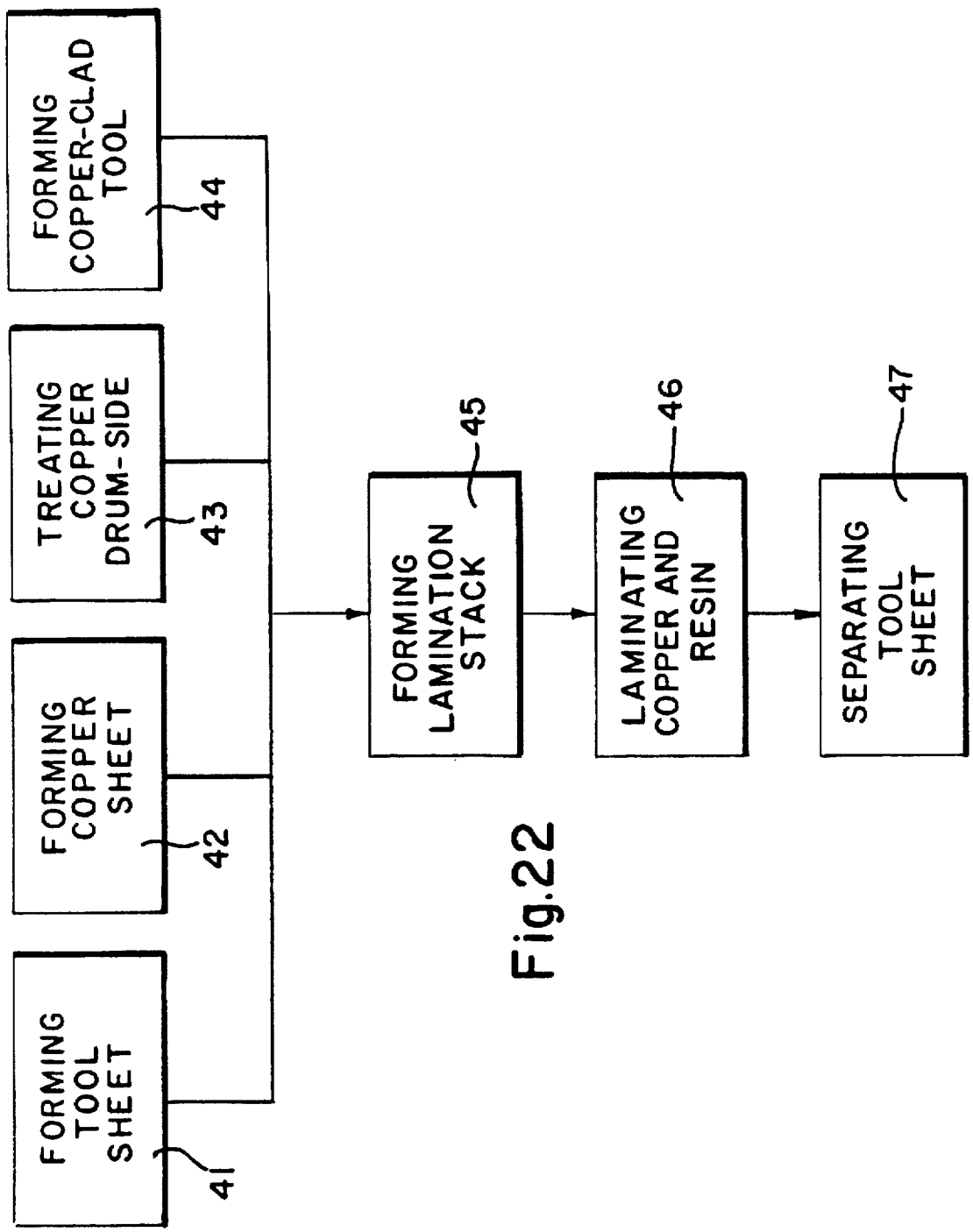
FIG. 22 is a flow chart showing a process embodying a second major aspect of this invention.
Figure 23:
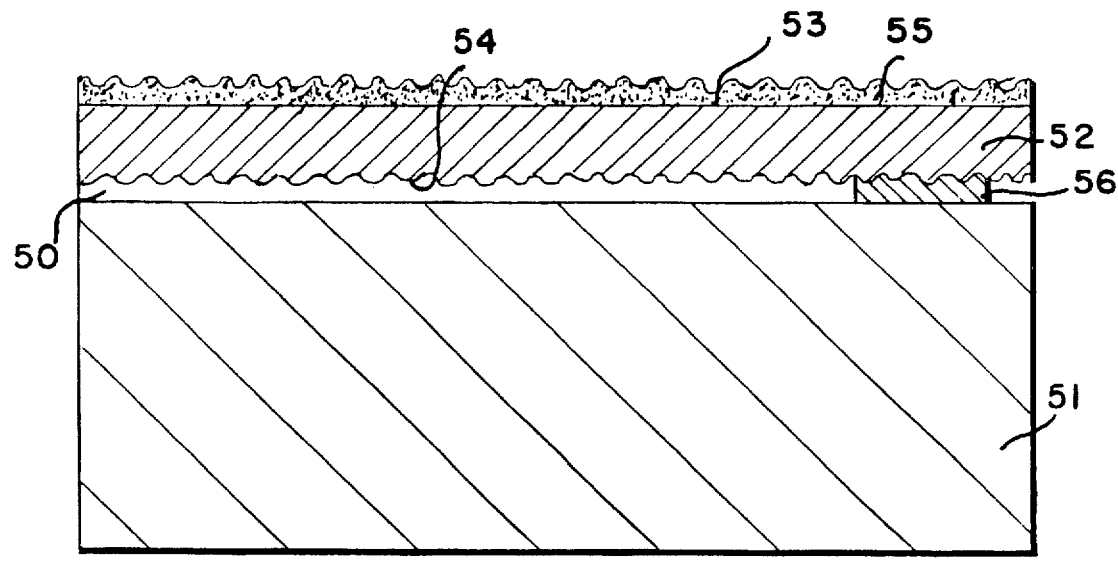
FIGS. 23–44 are diagrammatic sectional views of various foil-tool combinations and the steps in various processes involved it this variation of this invention.

FIG. 23 shows cross-sectional view of a single-sided tool 50 of the present invention. The tool is preferably a rectangular, rigid sheet or plate of aluminum 51. The conductive foil 52, preferably of copper, has a smooth or "drum-side" side 53 and a matte or rough side 54. The smooth side 53 is treated by plating, typically, with copper-zinc particles, to form an adhesion enhancement layer 55. FIG. 22 shows a foil 52 with the rough side 54 toward the plate 51. Bonding agent or adhesive 56 reversibly bonds the foil 52 to the plate 51.

Figure 24:
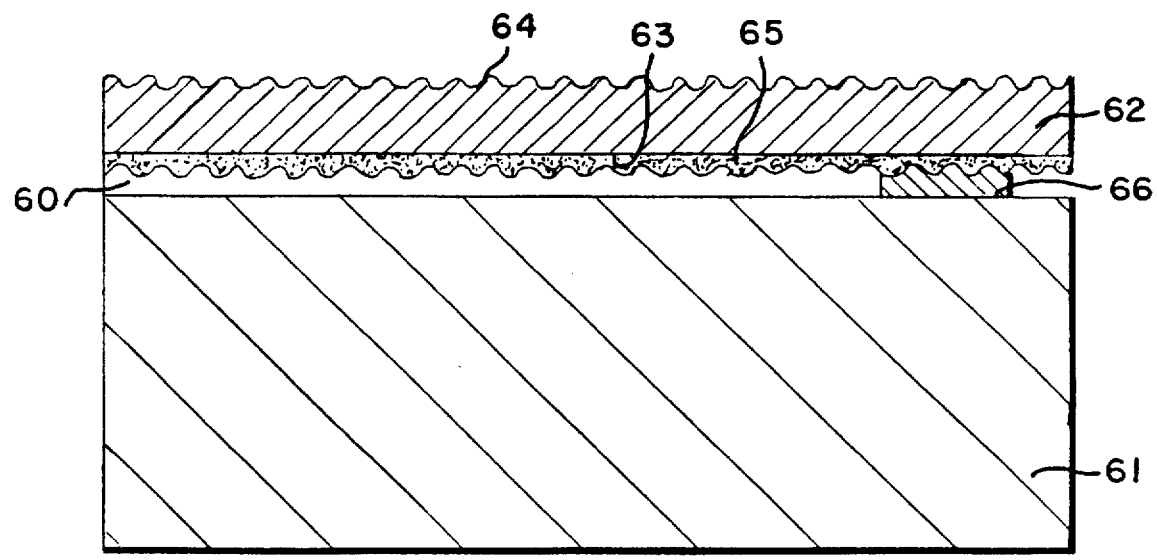
Figure 25:
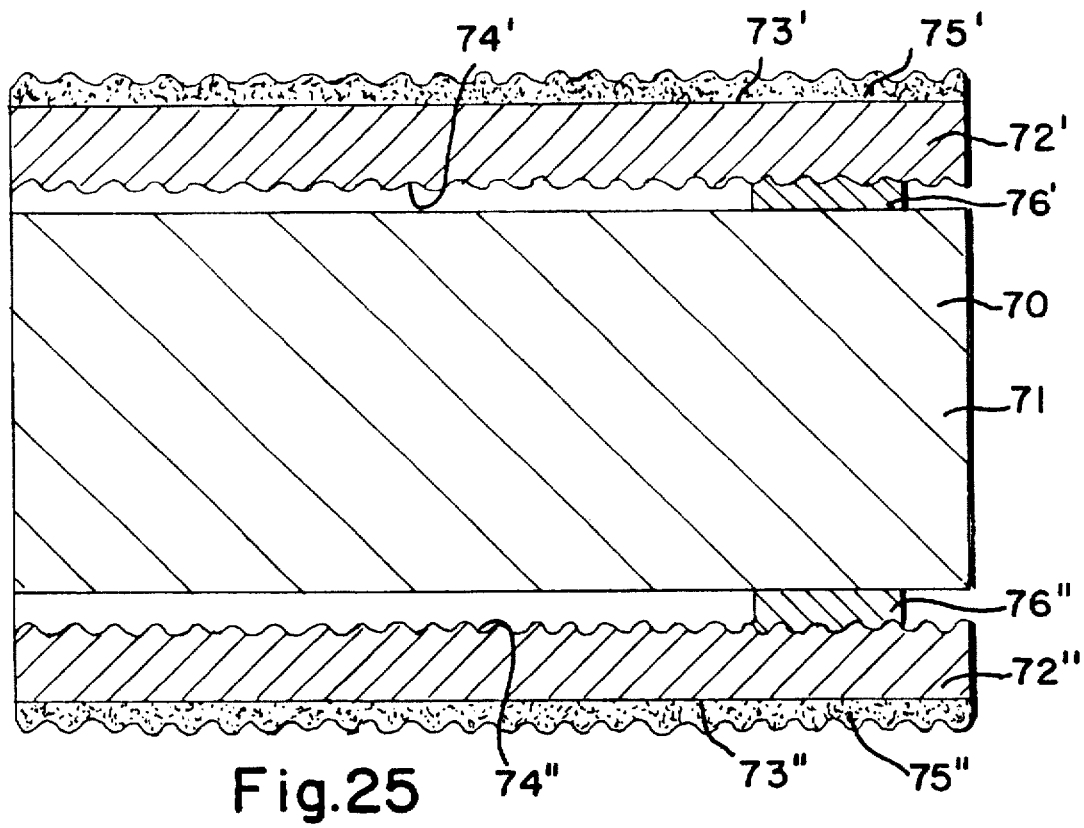

FIG. 24 shows a variation of the tool shown in FIG. 23, the variation being that the tool 60 in FIG. 24 has the treated drum-side of the foil toward the plate 61. The conductive foil 62, preferably of copper, has a smooth or "drum-side" side 63 and a matte or rough side 64. The smooth side 63 is treated by plating, typically, with copper-zinc particles, to form an adhesion enhancement layer 65. FIG. 24 shows a foil with the treated drum-side toward the tool. Bonding agent or adhesive 66 reversibly bonds the foil to the tool. FIG. 25 shows cross-sectional view of a double-sided tool 70 of the present invention. The tool is preferably a rectangular, rigid sheet or plate of aluminum 71. The conductive foils 72' and 72", preferably of copper, each have a smooth or "drum-side" side 73' and 73", respectively, and a matte or rough side 74' and 74", respectively. The smooth sides 73' and 73" are treated by plating, typically, with copper-zinc particles, to form adhesion enhancement layers 75' and 75". FIG. 25 shows the foils with the rough sides 74' and 74" toward the plate 71. Bonding agent or adhesive 76' and 76" reversibly bonds the foil to the tool.

Figure 26:
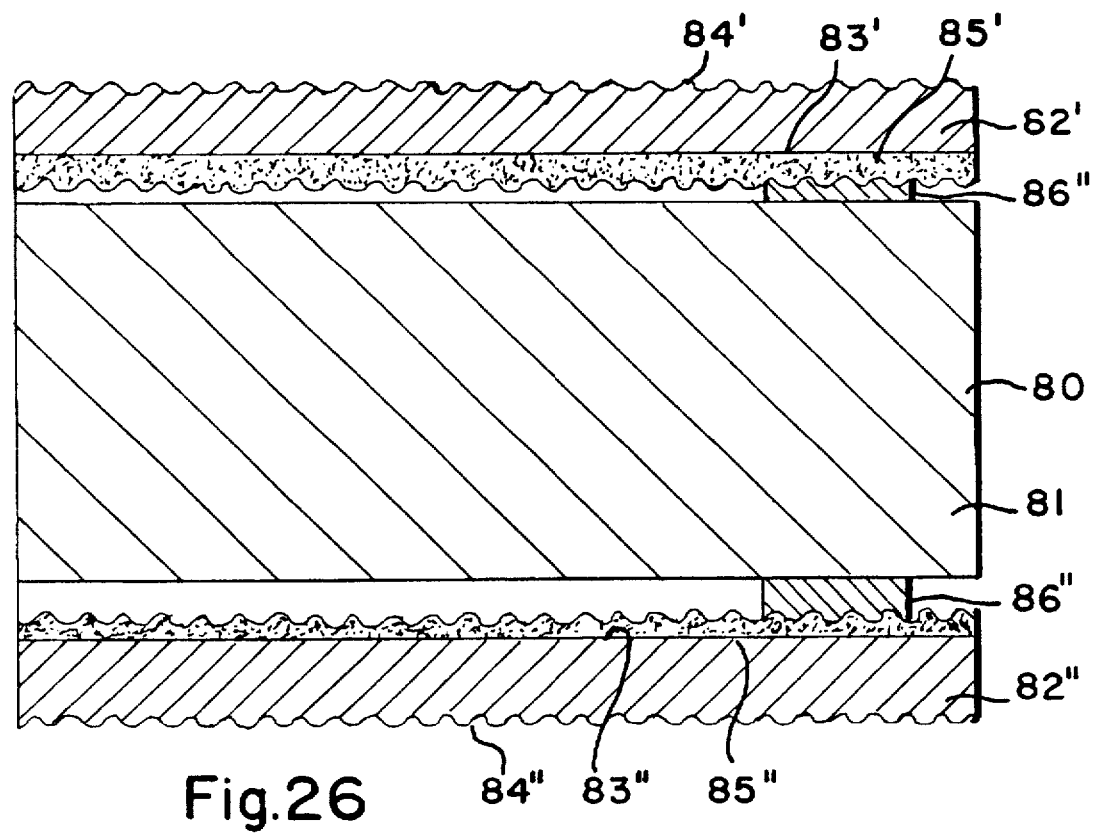

FIG. 26 shows a variation of the tool shown in FIG. 25, the variation being that the tool 80 in FIG. 26 has the treated drum-sides of the foils toward the plate 81. The conductive foils 82' and 82", preferably of copper, each have a smooth or "drum-side" side 83' and 83", respectively, and a matte or rough side 84' and 84", respectively. The smooth sides 83' and 83", are treated by plating, typically, with copper-zinc particles, to form an adhesion enhancement layer 85' and 85". FIG. 26 shows the foils with the treated drumside toward the plate 81. Bonding agent or adhesive 86' and 86" reversibly bond the foil to the tool.

Figure 27:
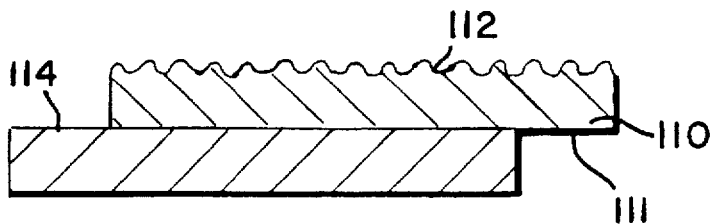
Figure 28:
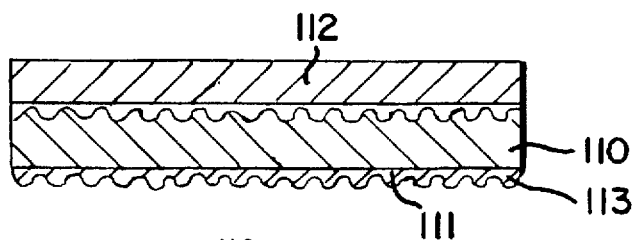
Figure 29:
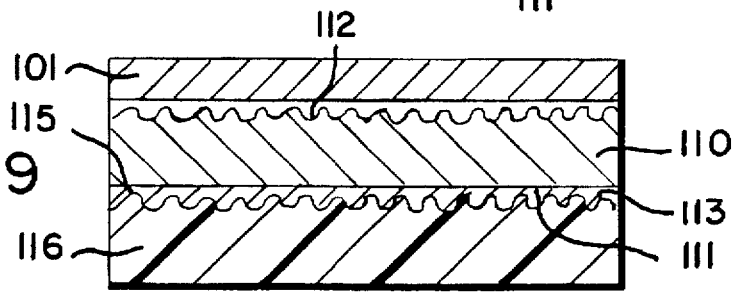
Figure 30:
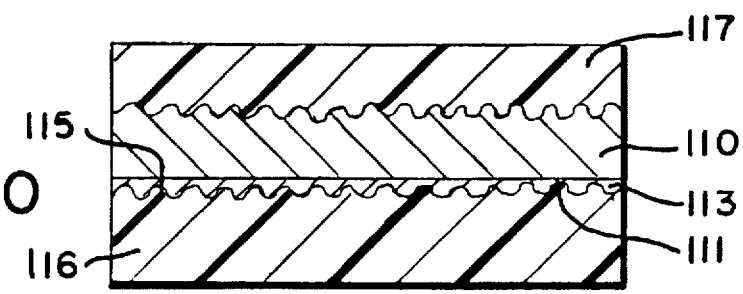
Figure 31:
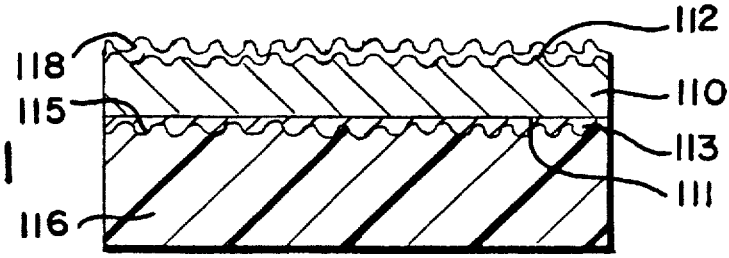
Figure 32:
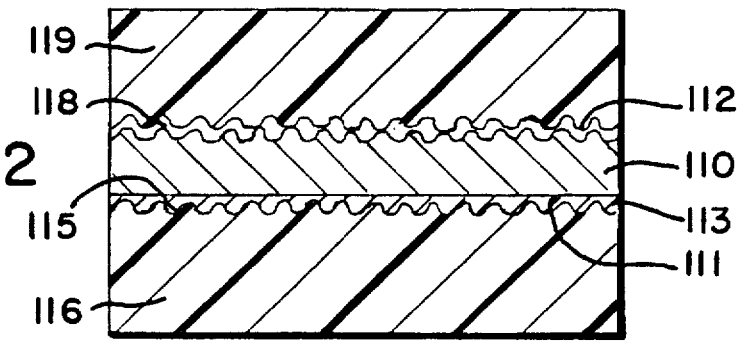

FIGS. 27–32 show a fourth embodiment of the process of the present invention. FIG. 27 shows a step in which the foil 110 is formed on a smooth surface 114. FIG. 28 shows a step in which the smooth side 111 of the foil 110 is treated with an adhesion enhancing plating 113. FIG. 28 shows the foil 110 mounted on tool sheet 101 or plate, preferably of aluminum. The matte side 112 is placed against the tool sheet 101. FIG. 29 shows a step in which the treated smooth surface 111 of the foil 110 is bonded to a first surface 115 of a substrate 116. This is accomplished by placing the stack shown in FIG. 29 into a lamination press. Pressure is applied inwardly and perpendicular to the tool sheet 101 and substrate 116. Simultaneously, heat is applied. Although FIG. 29 shows a very simple stack, those skilled in the art of laminate or circuit board manufacture will understand that this is diagrammatic of a more practical stack which would include numerous copper-resin interfaces and numerous tool-sheet-copper interfaces. Once the bond between the copper and the resin is formed, the bond between the tool sheet 101 and the copper 110 is terminated. The tool sheet or sheets 101 are removed from the copper and from the stack. The copper-resin laminate goes on to further processing, in earlier-recited ways. FIG. 30 shows a step in which the matte surface 112 of the foil 110 is coated with photo resist 117 without the need for a prior scrubbing process. FIG. 31 shows a step in which the matte surface 112, from which the photo resist has been removed, is treated with an oxidizing process, to form an oxide layer 118, without the need for a prior microetch and rinse process. It will be understood by those skilled in the art that if this foil is a cap or outside foil layer, it would not need the oxidizing treatment and would be complete without it and without the next step. FIG. 32 shows a step in which a second substrate 119 is bonded to the oxidized matte side 112 of the foil 110.

Figure 33:
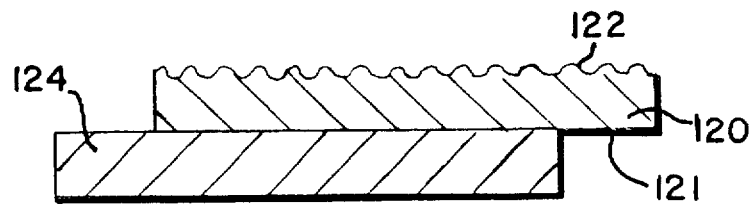
Figure 34:
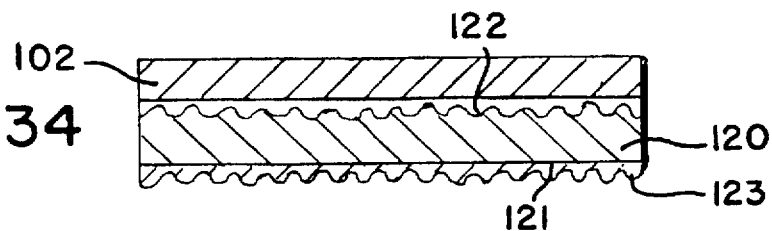
Figure 35:
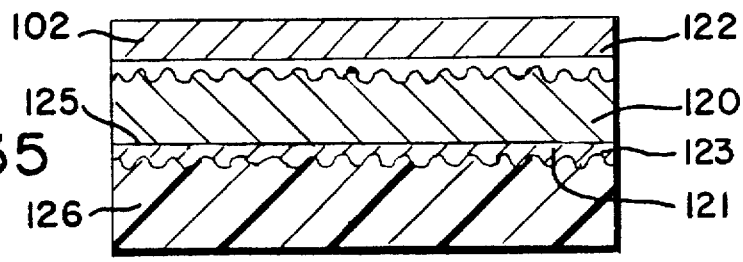
Figure 36:
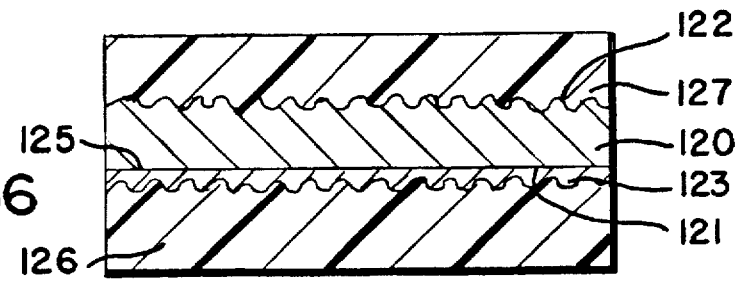
Figure 37:
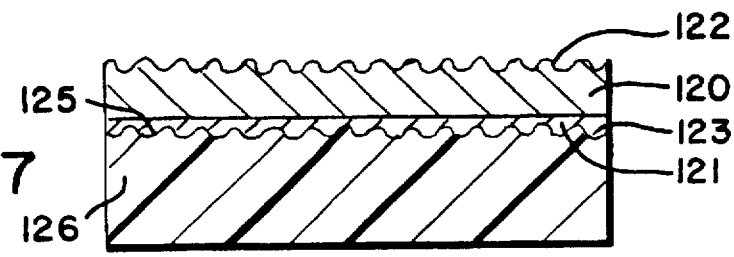
Figure 38:
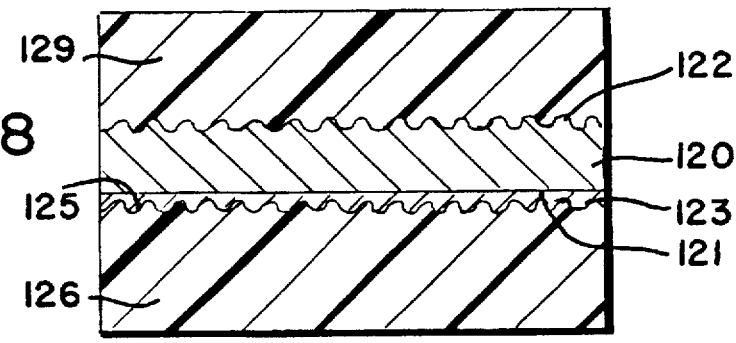

FIGS. 33–38 show a fifth embodiment of the process of the present invention. FIG. 33 shows a step in which the foil 120 is formed on a smooth surface 124. FIG. 34 shows a step in which the smooth side 121 of the foil 120 is treated with an adhesion enhancing plating 123. FIG. 34 shows the foil 120 mounted on tool sheet 102 or plate, preferably of aluminum. The matte side 122 is placed against the tool sheet 102. FIG. 35 shows a step in which the treated smooth surface 121 of the foil 120 is bonded to a first surface 125 of a substrate 126. This is accomplished by placing the stack shown in FIG. 35 into a lamination press. Pressure is applied inwardly and perpendicular to the tool sheet 102 and substrate 126. Simultaneously, heat is applied. Although FIG. 35 shows a very simple stack, those skilled in the art of laminate or circuit board manufacture will understand that this is diagrammatic of a more practical stack which would include numerous copper-resin interfaces and numerous tool-sheet-copper interfaces. Once the bond between the copper and the resin is formed, the bond between the tool sheet 102 and the copper 120 is terminated. The tool sheet or sheets 102 are removed from the copper 120 and from the stack. The copper-resin laminate goes on to further processing, in earlier-recited ways. FIG. 36 shows a step in which the matte surface 122 of the foil 120 is coated with photo resist 127 without the need for a prior scrubbing process. FIG. 37 shows a step in which the photo resist 127 has been removed from the matte surface 122. It will be understood by those skilled in the art that if this foil is a cap or outside foil layer, you would not have a subsequent relamination over this layer, so the next step would not be necessary. FIG. 38 shows a step in which a second substrate 129 is bonded to the untreated and unoxidized matte side 122 of the foil 120.

Figure 39:
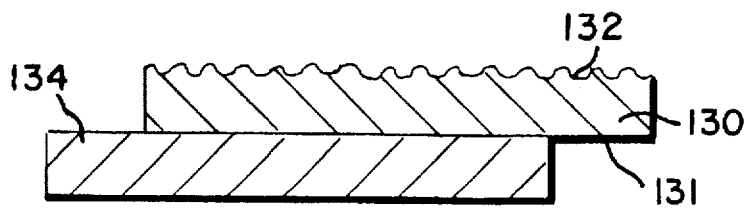
Figure 40:
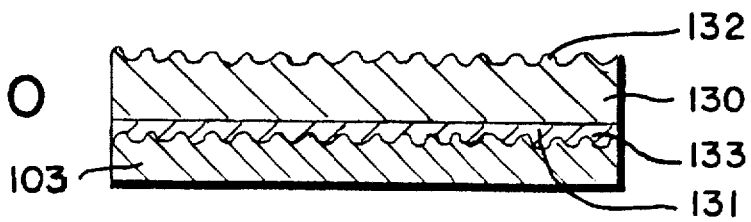
Figure 41:
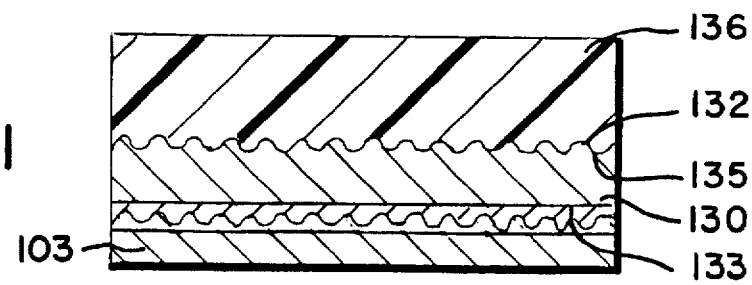
Figure 42:
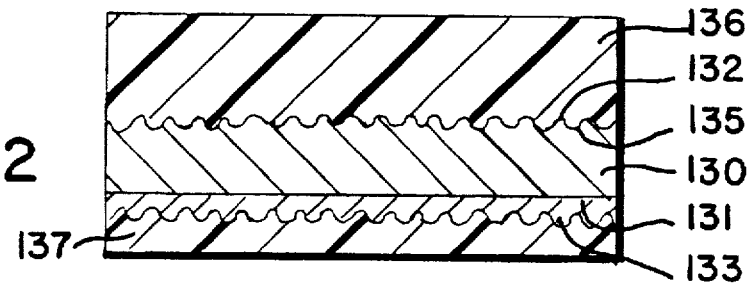
Figure 43:
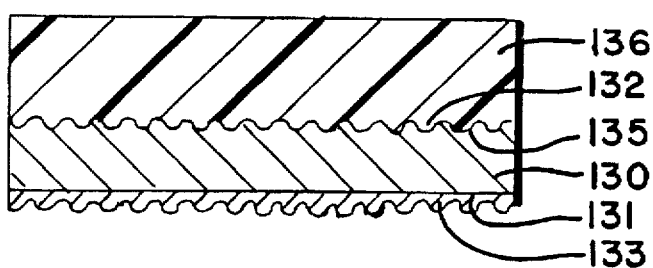
Figure 44:
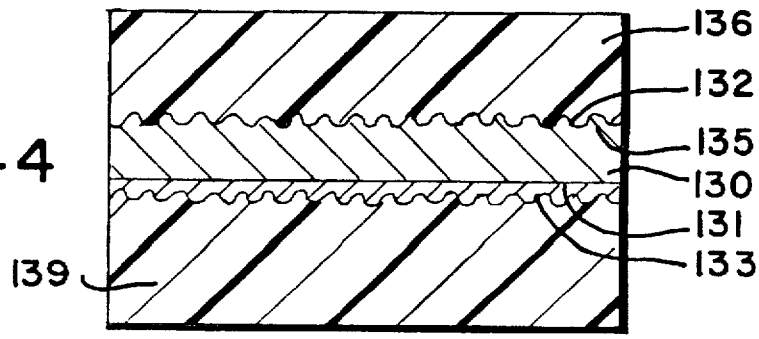

FIGS. 39–44 show a sixth embodiment of the process of the present invention. FIG. 39 shows a step in which the foil 130 is formed on a smooth surface 134. FIG. 40 shows a step in which the smooth side 131 of the foil 130 is treated with an adhesion enhancing plating 133. FIG. 40 shows the foil 130 mounted on tool sheet 103 or plate, preferably of aluminum. The treated smooth side 131 is placed against the tool sheet 103. FIG. 41 shows a step in which the untreated matte surface 132 of the foil 130 is bonded to a first surface 135 of a substrate 136. This is accomplished by placing the stack shown in FIG. 41 into a lamination press. Pressure is applied inwardly and perpendicular to the tool sheet 103 and substrate 136. Simultaneously, heat is applied. Although FIG. 41 shows a very simple stack, those skilled in the art of laminate or circuit board manufacture will understand that this is diagrammatic of a more practical stack which would include numerous copper-resin interfaces and numerous tool-sheet-copper interfaces. Once the bond between the copper 130 and the resin 136 is formed, the bond between the tool sheet 103 and the copper 130 is terminated. The tool sheet or sheets 103 are removed from the copper 130 and from the stack. The copper-resin laminate goes on to further processing, in earlier-recited ways. FIG. 42 shows a step in which the treated smooth surface 131 of the foil 130 and plated layer 133 are coated with photo resist 137 without the need for a prior scrubbing process. FIG. 43 shows a step in which the photo resist 137 has been removed from the treated smooth surface 131. It will be understood by those skilled in the art that if this foil is a cap or outside foil layer, you would not have a subsequent relamination over this layer, so the next step would not be necessary. FIG. 44 shows a step in which a second substrate 139 is bonded to the treated smooth side 131 of the foil 130.

A substantial amount of work and data have been compiled using the drum side treated metal foil (drum side treated foil), and it has proven to exceed virtually every expectation in regards to improved processability. Additionally, several previously unexpected benefits have been realized, opening up even more possibilities for the printed wiring board industry to reduce both processing costs, processing time and hazardous wastes.

There are a total of six areas which have been identified where drum side treated foil has provided either better than expected or previously unsuspected benefits in the manufacture of multilayer printed wiring boards (PWB). These areas are:

1. Innerlayer yield improvement, particularly on higher complexity circuitry

2. Improved manufacturability of "ultra-thin" foils

3. Hazardous waste generation reduction through process elimination

4. PWB defect known as "pink ring" elimination through process elimination

5. Finished PWB thermal reliability improvement

6. Compatibility with concurrently developed product known as "permanent photoresist".

In addition to these six benefits, two substantial benefits have been realized in the laminate manufacture process.

1. Improved drum side treated foil clad laminate productivity

2. Improved drum side treated foil clad laminate copper surface yields

UNEXPECTED AND NEW BENEFIT DISCLOSURE - PWB PROCESS

Each of these previously mentioned benefits will be described in detail below. I will also show that these benefits have been made possible only with the use of drum side treated foil and how the invention of this product and successful implementation in a laminate and PWB process can provide substantial, previously unrealized benefits. These benefits will benefit manufacturers, end users and our environment.

A previously unexpected benefit is the dramatic improvement of first pass yields (no rework required to accept) at the innerlayer manufacturing process of a PWB company. Through the use of drum side treated foil alone, case studies and high volume manufacturing data collection show that yields will be improved. More importantly, the data shows that drum side treated foil can move the industry to the next level of technology with substantially higher yields. As the complexity of innerlayer circuitry increases, the magnitude of the yield increase seen with drum side treated foil increases. Table 1 (FIG. 45) summarizes one manufacturer's data collected during a three month period. This table shows that in every circuitry complexity rating produced, a yield improvement over regular foil clad laminates was realized using drum side treated foil clad laminates.

As the reader can see, complexity grade A, which is the most difficult technology consisting of etched lines and spaces finer than 0.006 inches, had a 3.8% improvement over conventional foils.

In addition to this data, a case study was performed with a large PWB manufacturer. The object of this case study was to compare yields on product which are considered to be at the leading edge of technology. This PWB manufacturer was attempting to manufacture innerlayer circuitry with line and space widths at 0.003 inches. The data is shown in Table 2 (FIG. 46).

Table 2 (FIG. 46) summarizes the results of three separate studies conducted by the technical engineering departments of a laminate manufacturing company and a large PWB manufacturer. Case study number one showed a regular single treat copper foil clad laminate innerlayer first pass yield of 85.5% while the drum side treated foil innerlayers yielded 94.3%, an increase of 10.3%. Case study two showed even more favorable results, with drum side treated foil yielding over 20% higher. Case study three was similar with a 16% improvement. What makes the case study results so significant is that processing conditions were kept identical for the two products, thus eliminating any outside influence that may have unknowingly changed the yield results.

With yield improvements such as these, manufacturers of PWBs will realize substantial cost savings as well as improved cycle times. In addition, since chemical processing will be reduced by a directly opposite proportionate amount as seen in yield increase, hazardous waste generation will also be reduced by an equally opposite proportionate amount.

A second, previously unrealized benefit comes in the manufacture of "ultra-thin" metal foils. The base foil thickness is referred to by weight per area in units of ounce per square foot. Foil thickness' considered standard to the industry are ½, 1 and 2 oz/ft$^2$. Foil thickness' below ½ oz/ft$^2$ are increasing in popularity as PWB density increases. The thinner foils offer finer circuit definition and reduced circuit width. There are serious drawbacks to thinner foils however.

To the foil manufacturer, manufacturing ultra-thin (less than ½ oz/ft$^2$) double treated foil is very difficult. The "treatment", which is electroplated onto the base foil in a continuous process is plated onto the foil which is used as the cathode in the plating reaction. On ultra-thin foils, the placement of anodes on either side of the copper web during treating causes rejects known as "burning". The current density required for treatment deposition on two sides is too great for the foil mass acting as the cathode, causing a breakdown in the electrical deposition process. With the advent of drum side treated foil, manufacturers have an option to retain the ease of manufacture and ease of handling of traditional single treat foils, while achieving the improved functionality of double treat foil. It has already been shown that PWB manufacturers will experience a reduction in the amount of hazardous waste generated simply through a yield improvement. In addition to this source of waste reduction, a significantly larger portion of the amount of hazardous waste generation can be eliminated. This realization comes from the number of chemical processes that are eliminated.

Table 3A (FIG. 47) shows the typical wet process steps required in the manufacture of an innerlayer of a PWB. It is shown that the typical process consists of a total of twenty-five (25) wet processing steps. These twenty five (25) steps consist of eleven (11) chemical processes, eleven (11) rinses and three (3) drying steps.

The typical, and recommended, processing steps for the manufacture of an innerlayer of a PWB clad with drum side treated foil total only fifteen (15). This is a forty percent (40%) reduction of wet processing steps. These fifteen (15) wet processing steps include seven (7) chemical processes, six (6) rinses and two (2) drying steps.

It should be realized that the amount of hazardous waste generation will be reduced by an equal proportion to the amount of wet process steps eliminated. Additionally, water consumption will be reduced by an equal proportion.

It should be noted that the case study summarized in Table 2 (FIG. 46) was performed using the "Typical Invention Wet Process Steps" described in Table 3B (FIG. 45). To review, in the series of case studies an average ten percent (10%) yield improvement was seen utilizing wet process that was reduced by forty percent (40%).

Beyond the elimination of forty percent of the wet processes, it has also been realized that with drum side treated foil, the oxide process can efficiently operate at fifty percent (50%) of the concentration required for regular foil. This unexpected benefit effectively reduces the cost to maintain this expensive bath by fifty percent (50%).

Additionally, extensive experimentation has proven that the oxide reduction process and rinse can be eliminated. With the implementation of this development, the total wet process steps will have been reduced by forty-eight percent (48%).

It should be noted that the oxide reduction process was invented only recently (Hitachi U.S. Pat. No. 4,642,161) and is used only to eliminate the occurrence of a phenomena known in the PWB industry as "pink ring". The oxide reduction process, simply put, reduces the valance of the surface copper ions from +2 state to +1 valance state. The resulting cuprous oxide is not susceptible to attack by many of the acids used in the manufacture of PWBs. This process, while highly effective in eliminating pink ring, is expensive and poses a safety hazard.

Basic knowledge of chemistry is all that is necessary to know the reality of the violence of the reaction between a strong oxidizer and a strong reducer. This is exactly the process at the innerlayer oxidation process which utilizes a reduction bath. Typically, these tanks are in line and only separated by a rinse bath. Any co-mingling of these chemistries, either from an accidental spill or from excess carryover, can result in a violent exothermic reaction.

Since drum side treated foil utilizes the naturally rough plated dendrite of the metal foil as an adhesion enhancer, the thickness of the oxide required to achieve an acceptable bond strength is less than fifty percent (50%) that required on conventional foils. This, in addition to the naturally formed barrier of the dendrite itself, has been demonstrated to prohibit the leeching of acids used to clean the drilled holes of a PWB onto the oxided layer, where the acids cause the "pink ring" defect. A physical boundary of solid copper, the dendrite, prohibits the leeching so long as the thickness of the oxide is significantly reduced from standard industry practices.

As previously stated "A second, equally important objective of the present invention is to improve the reliability of the overall multilayer-layer circuit board package. By strengthening the weakest adhesion link which exists in today's technology, the oxide, the finished product will be less prone to delamination when operating in harsh conditions or normal conditions for long periods of time."

This objective has not only proven to be true, it has surpassed even the inventor's highest hopes. Prior to the invention of drum side treated foil, it was not uncommon for the scrap at the assembly stage of manufacture to exceed one and one-half percent (1.5%) of the completed PWBs due to delamination. It should be noted for the record that assembly is the final step in the manufacture of a completely functional PWB where components (integrated circuits, resistors, capacitors, math coprocessors, etc.) are affixed to the surface of the PWB. This is obviously the point where all value added work to a PWB culminates and where failure of the circuit board is particularly costly.

Drum side treated foil has been used on 100% of one PWB manufacture's product for two years. Since the implementation of drum side treated foil, the assembly scrap due to delamination not only decreased, it has been completely eliminated! This is a direct result of the oxide coated matte side of the foil having an adhesion strength which is forty percent (40%) greater than that of oxide coated conventional foil.

One final, previously unrealized benefit of drum side treated foil involves its use with a product which is new to the PWB industry and known as permanent photoresist. The current industry practice in innerlayer manufacture is to laminate a light sensitive photoresist to the laminate, expose this to intense light with the innerlayer circuit image on either side, proceed through a film developing process, chemically etch the exposed copper and completely remove the remaining exposed photoresist using a strong caustic solution.

As set out in Table 3C (FIG. 49), permanent photoresist remains on the surface of the unetched foil and replaces the need for an oxide process altogether (See, for example, European Patent Application 93301724.6 of MORTON INTERNATIONAL, INC.). This product is still in the development phase, but has been run successfully only with drum side treated foil clad laminate.

It is obvious that minor changes may be made in the form and construction of the invention without departing from the material spirit thereof. It is not, however, desired to confine the invention to the exact form herein shown and described, but it is desired to include all such as properly come within the scope claimed.

The invention having been thus described, what is claimed as new and desired to secure by letters patent is:

1. A method of forming a printed circuit board comprising the steps of:

(a) depositing a quantity of an electrically conductive material onto a smooth forming surface to form a foil having a first smooth surface which forms against the forming surface, and a second, surface which forms away from the forming surface, (b) electroplating an adhesion promoting layer on said first surface which causes the formation of nodular or dendritic particles on said first foil side of the foil, (c) bonding said first, smooth surface to a first electrically insulative substrate, and (d) bonding said substrate and said second surface to a second electrically insulative substrate, without applying said adhesion promoting layer to the second surface and without applying a second treatment in which said second foil side would be chemically oxidized to form metal oxide dendrites.

2. A method of forming a printed circuit board comprising the steps of:

(a) depositing a quantity of an electrically conductive material onto a smooth forming surface to form a foil having a first, smooth surface which forms against the forming surface, and a second, at surface which forms away from the forming surface, (b) electroplating an adhesion promoting layer on said first, smooth surface which causes the formation of nodular or dendritic particles on said first surface, (c) bonding said second matte surface to a first electrically insulative substrate without applying said adhesion promoting layer to the second surface, and (d) bonding said first substrate and said first smooth surface to a second electrically insulative substrate without applying a second treatment in which said first, smooth surface would be chemically oxidized to form metal oxide dendrites.

3. A method of manufacturing a conductive foil and resin laminate for use in multilayer circuit board, comprising the steps of:

(a) forming a tool sheet having a first surface, (b) forming a conductive foil having a smooth side and a matte side, (c) subjecting the smooth side of the foil to an adhesion-promoting electroplating treatment which causes the formation of nodular or dendritic particles on said first, smooth side of the foil, but at no time during the manufacture of said multilayer circuit board subjecting the matte side to said adhesion promoting electroplating treatment, or to a second treatment in which said second foil side would be chemically oxidized to form metal oxide dendrites which are subsequently reduced, (d) reversibly bonding one of the sides of the foil to one of the sides of the tool sheet to form a foil-clad tool, (e) positioning the foil, which is on the foil-clad tool, in contact with a resin layer in a laminating press, (f) applying laminating conditions to the foil-clad tool and resin layer to bond the foil to the resin layer, (g) following step f), terminating the bond between the tool sheet and the foil and separating the tool sheet from the foil.

4. A method of forming a multi-layer laminate, comprising the steps of:

(a) forming a first electrically insulative substrate, (b) forming an etched, electrically conductive circuit pattern by circuit etching from a metal foil having a smooth side which has been subjected to an adhesion promoting electroplating treatment which causes formation of nodular or dendritic particles and a matte side which has not been subjected to said adhesion promoting treatment or a second treatment in which said second foil side would be chemically oxidized to form metal oxide dendrites which are subsequently reduced, said metal foil having been bonded to said first substrate by said treated smooth side prior to circuit etching, and (c) bonding a second electrically insulative substrate to said first substrate and to said etched conductive circuit pattern after the circuit etching, wherein said circuit pattern has been etched from said matte side of said foil toward said treated smooth side.

5. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the treated smooth surface, (c) the foil surface is not scrubbed or rinsed of antioxidant prior to application of the photoresist material, and (d) photoresist material remaining after selective removal is not removed from the matte surface of the foil, whereby no oxidation step or oxidation followed by reduction step is performed.

6. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the treated smooth surface, (c) the foil surface is not scrubbed or rinsed of antioxidant prior to application of the photoresist material, (d) photoresist material remaining after selective removal is not removed from the matte surface of the foil, whereby no oxidation step or oxidation followed by reduction step is performed, and (e) a second electrically insulative substrate is bonded to the first substrate and the untreated and unoxidized photoresist covered matte surface of the foil without prior micro-etch or rinse steps.

7. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the treated smooth surface, (c) the foil surface is not scrubbed or rinsed of antioxidant prior to application of the photoresist material, (d) photoresist material remaining after selective removal is removed from the matte surface of the foil, and (e) the matte surface is not treated to form an oxide layer.

8. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the treated smooth surface, (c) the foil surface is not scrubbed or rinsed of antioxidant prior to application of the photoresist material, (d) photoresist material remaining after selective removal is removed from the remaining matte surface of the foil, (e) the matte surface is not treated to form an oxide layer, and (f) a second electrically insulative substrate is bonded to the first substrate and the untreated and unoxidized, previously photoresist-covered matte surface of the foil without prior micro-etch or rinse steps.

9. A method of forming a printed circuit board involving the steps of forming an electrically conductive foil having a relative smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the untreated matte surface, (c) the foil surface is not scrubbed or rinsed of antioxidant prior to application of the photoresist material, (d) photoresist material remaining after selective removal is not removed from the treated smooth surface of the foil, whereby no oxidation step or oxidation followed by reduction step is performed, and (e) a second electrically insulative substrate is bonded to the first substrate and the treated but unoxidized, photoresist-covered smooth surface of the foil without prior micro-etch or rinse steps.

10. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the untreated matte surface, (c) the foil surface is not scrubbed or rinsed of antioxidant prior to application of the photoresist material, (d) photoresist material remaining after selective removal is removed from the remaining treated smooth surface of the foil, (e) the treated smooth surface is not treated to form an oxide layer, and (f) a second electrically insulative substrate is bonded to the first substrate and the treated but unoxidized, previously photoresist-covered smooth surface of the foil without prior micro-etch or rinse steps.

11. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the treated smooth surface, (c) photoresist material remaining after selective removal is not removed from the matte surface of the foil, no oxidation or oxidation followed by reduction step is performed, and (d) a second electrically insulative substrate is bonded to the first substrate and the untreated and unoxidized, photoresist-covered matte surface of the foil without prior micro-etch or rinse steps.

12. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the treated smooth surface, (c) photoresist material remaining after selective removal is removed from the matte surface of the foil, and (d) the matte surface is not treated to form an oxide layer.

13. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the treated smooth surface, (c) photoresist material remaining after selective removal is removed from the remaining matte surface of the foil, (d) the matte surface is not treated to form an oxide layer, and (e) a second electrically insulative substrate is bonded to the first substrate and the untreated and unoxidized matte surface of the foil without prior micro-etch or rinse steps.

14. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the untreated matte surface, (c) photoresist material remaining after selective removal is not removed from the treated smooth surface of the foil, no oxidation step or oxidation step followed by reduction step is performed, and (d) a second electrically insulative substrate is bonded to the first substrate and the treated smooth, photoresist-covered side of the foil without prior micro-etch, rinse, or oxidation treatment steps.

15. A method of forming a printed circuit board involving the steps of forming an electrically conductive foil having a relatively smooth first surface and a matte second surface, electroplating a first adhesion promoting treatment on the smooth surface of the foil which causes the formation of nodular or dendritic metal particles on said first foil side of the foil, treating the foil with an antioxidant treatment, bonding the foil to a first electrically insulative substrate, forming a circuit pattern making use of the bonded foil by the application and selective removal of a photoresist material characterized by the fact that (a) the matte side of the foil is not subjected to said first adhesion promoting treatment, (b) the surface of the foil bonded to the first electrically insulative substrate is the untreated matte surface, (c) photoresist material remaining after selective removal is removed from the treated smooth surface of the foil, (d) the treated smooth surface is not treated to form an oxide layer, and (e) a second electrically insulative substrate is bonded to the first substrate and the treated but unoxidized smooth side of the foil without micro-etch, rinse, or oxidation treatment steps.

* * * * *

UNITED STATES PATENT AND TRADEMARK OFFICE
CERTIFICATE OF CORRECTION

PATENT NO : 5,779,870
DATED : April 13, 1995
INVENTOR(S) : Seip

It is certified that error appears in the above-identified patent and that said Letters Patent is hereby corrected as shown below:

Column 18

In Claim 1:

Line 4, insert after the word "second" --,matte--.

Line 11, insert after the word "second" --,matte--.

In Claim 2:

Line 23, insert after the word "second" --,matte--.

Line 23, delete the word "at" before "surface".

Signed and Sealed this

Sixteenth Day of March, 1999

*Attest:*

*Attesting Officer*

Q. TODD DICKINSON

*Acting Commissioner of Patents and Trademarks*